(12) United States Patent
Karmonik

(10) Patent No.: US 7,319,328 B1
(45) Date of Patent: Jan. 15, 2008

(54) SYSTEM, METHOD, AND COMPUTER-READABLE MEDIUM FOR MAGNETIC RESONANCE DIFFUSION ANISOTROPY IMAGE PROCESSING

(75) Inventor: Christof Karmonik, Sugar Land, TX (US)

(73) Assignee: The Methodist Hospital Research Institute, Houston, TX (US)

( * ) Notice: Subject to any disclaimer, the term of this patent is extended or adjusted under 35 U.S.C. 154(b) by 0 days.

(21) Appl. No.: 11/539,004

(22) Filed: Oct. 5, 2006

(51) Int. Cl.
*G01V 3/00* (2006.01)

(52) U.S. Cl. ...................... 324/318; 324/309

(58) Field of Classification Search ........ 324/300–322; 600/407–445; 702/183, 189
See application file for complete search history.

(56) References Cited

U.S. PATENT DOCUMENTS

| | | | | |
|---|---|---|---|---|
| 5,969,524 A * | 10/1999 | Pierpaoli et al. | ............ | 324/307 |
| 6,489,766 B1 * | 12/2002 | Alsop | ............ | 324/313 |
| 6,567,684 B1 * | 5/2003 | Chenevert et al. | ............ | 600/410 |
| 6,614,226 B2 * | 9/2003 | Wedeen | ............ | 324/309 |
| 6,845,342 B1 * | 1/2005 | Basser et al. | ............ | 702/183 |
| 6,853,189 B1 * | 2/2005 | Pipe | ............ | 324/307 |
| 6,992,484 B2 * | 1/2006 | Frank | ............ | 324/307 |

* cited by examiner

*Primary Examiner*—Brij B. Shrivastav
(74) *Attorney, Agent, or Firm*—Todd Mattingly; King & Spalding LLP

(57) ABSTRACT

A system, method, and computer-readable medium for magnetic resonance diffusion anisotropy image processing are provided.

48 Claims, 17 Drawing Sheets

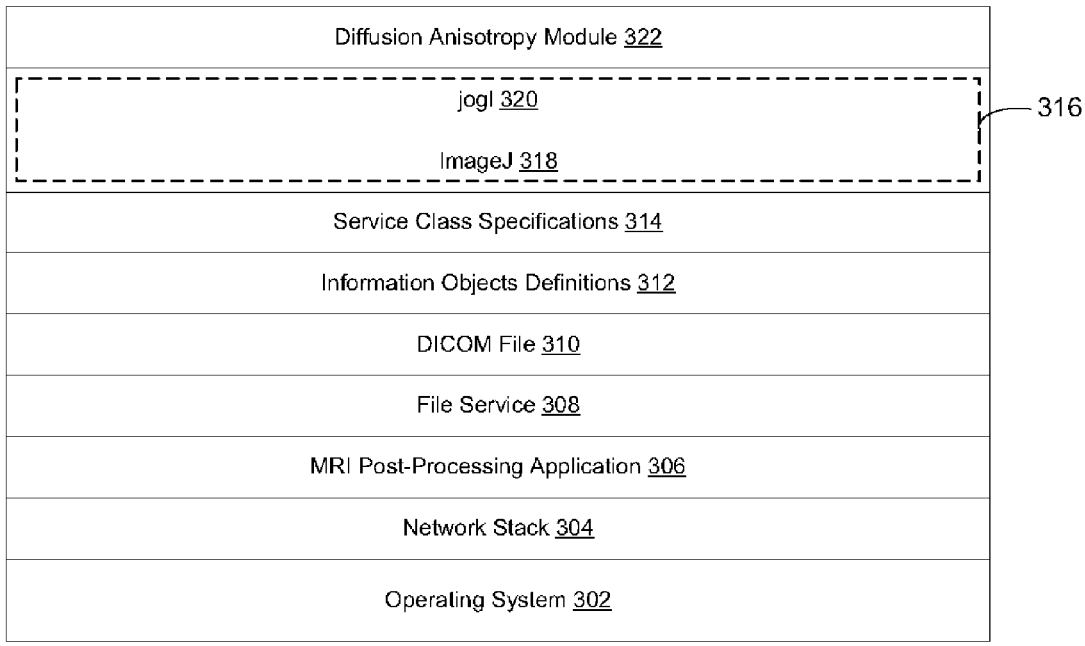
Figure 3A
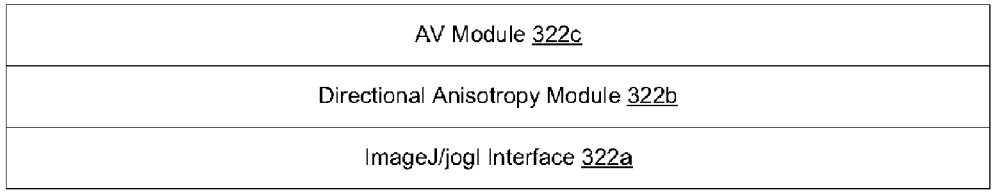
Figure 3B
$$D = \begin{Bmatrix} D_{XX} & D_{XY} & D_{XZ} \\ D_{YX} & D_{YY} & D_{YZ} \\ D_{ZX} & D_{ZY} & D_{ZZ} \end{Bmatrix}$$
Figure 4

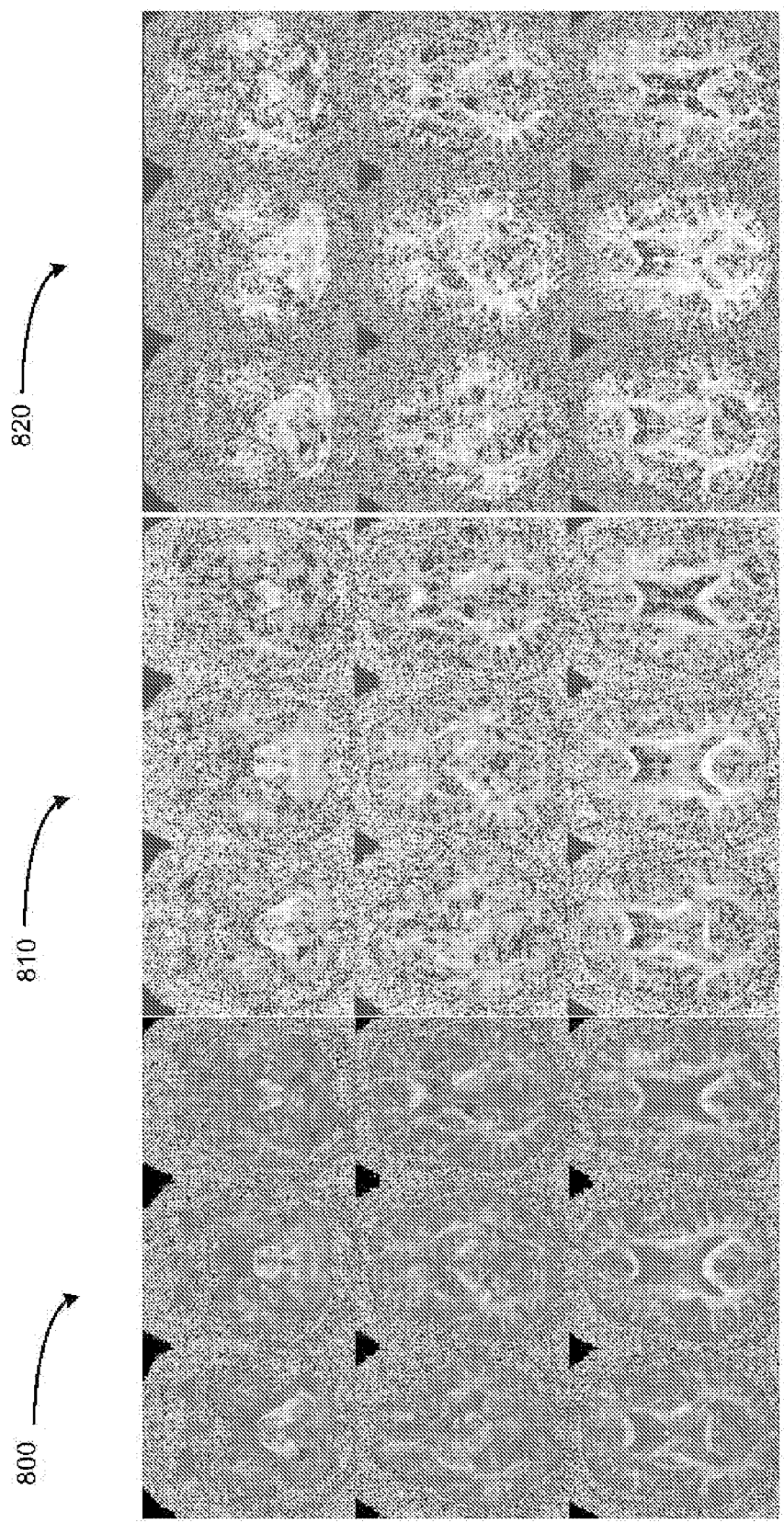

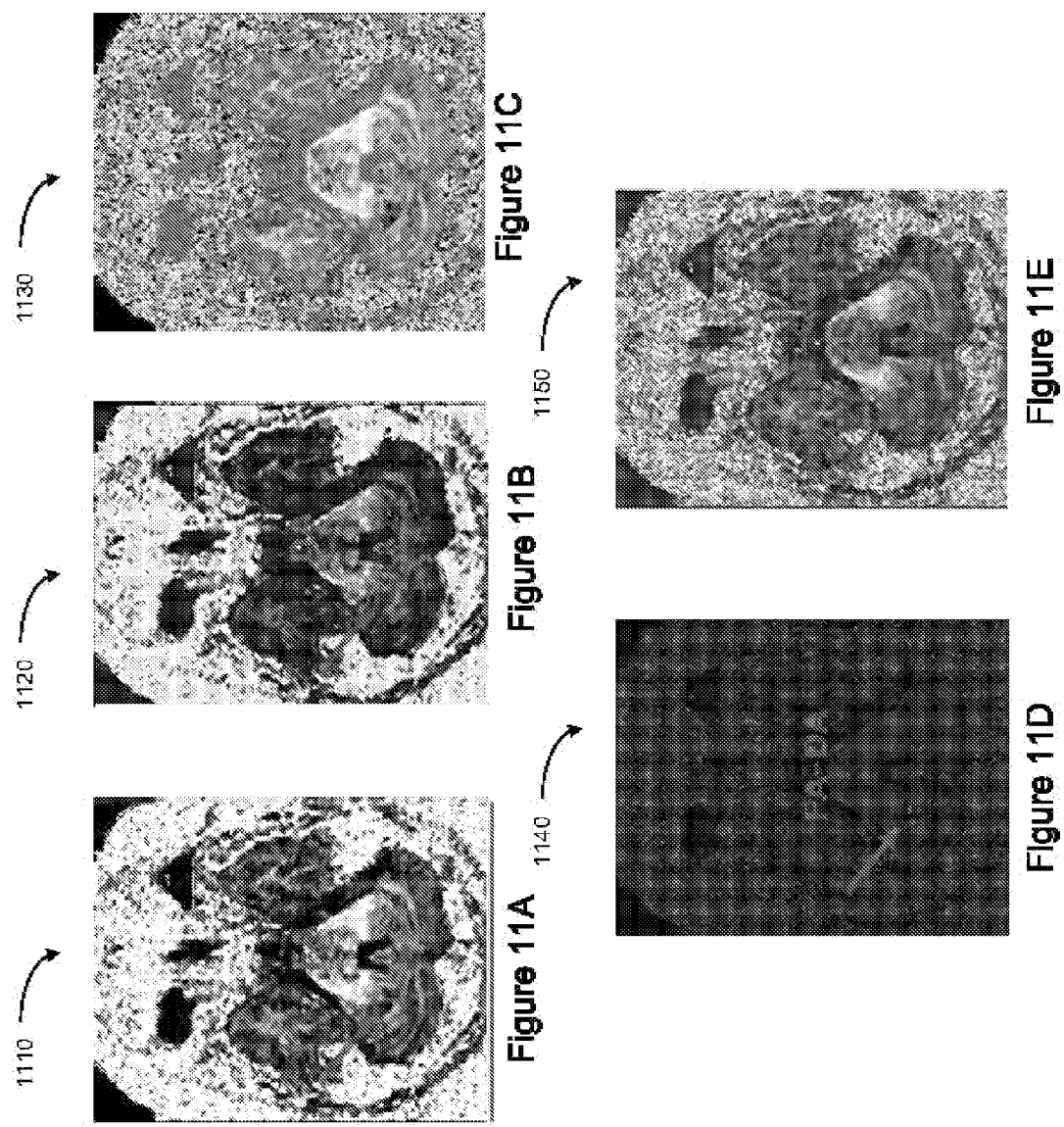

SYSTEM, METHOD, AND COMPUTER-READABLE MEDIUM FOR MAGNETIC RESONANCE DIFFUSION ANISOTROPY IMAGE PROCESSING

BACKGROUND

Embodiments disclosed herein relate to, in general, imaging systems and, in particular, to magnetic resonance image post-processing techniques.

BRIEF DESCRIPTION OF THE DRAWINGS

Aspects of the present disclosure are best understood from the following detailed description when read with the accompanying figures, in which:

FIG. 3A is a diagrammatic representation of an embodiment of a software configuration of the computer system depicted in 2 that facilitates magnetic resonance imaging post-processing in accordance with embodiments disclosed herein;

FIG. 3B is a diagrammatic representation of an embodiment of a diffusion anisotropy module implemented in accordance with an embodiment;

FIG. 4 is a diagrammatic representation of a diffusion tensor;

FIG. 8A depicts a difference image generated in accordance with an embodiment that exhibits image features not visible in fractional anisotropy images;

FIG. 8B depicts a color coded difference image obtained by subtracting the directional anisotropy calculations from fractional anisotropy calculations and imaging the difference with red color-coding depicting the image differences in accordance with an embodiment;

FIG. 8C depicts a ratio image generated from a ratio of fractional anisotropy to directional anisotropy calculations in accordance with an embodiment;

FIG. 11A-11F depict images and 3D profiles that demonstrate imaging differences between traditional fractional anisotropy imaging calculations and directional anisotropy imaging calculations made in accordance with embodiments disclosed herein;

DETAILED DESCRIPTION

Figure 1:
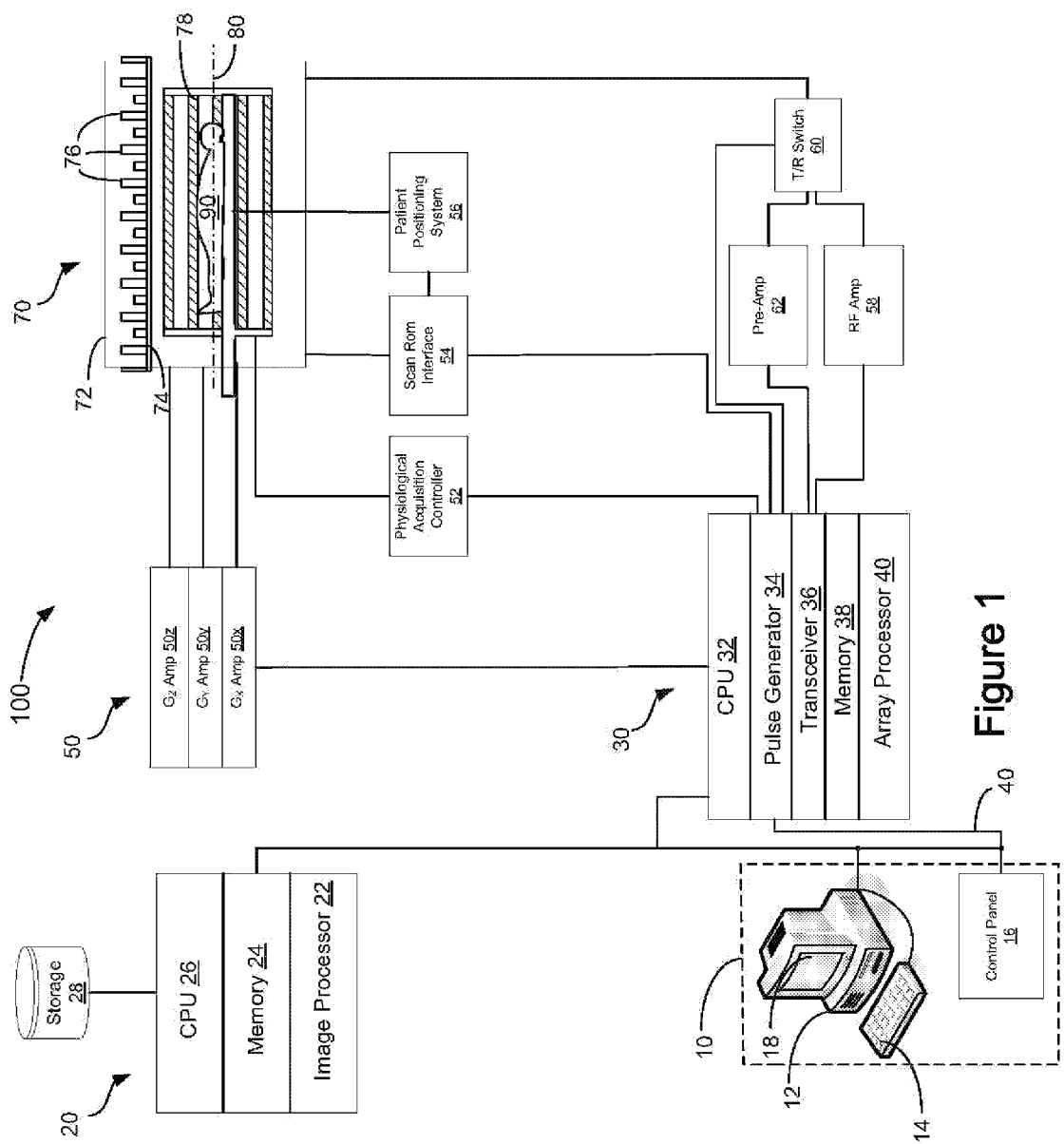
FIG. 1 is a diagrammatic representation of an exemplary magnetic resonance imaging system in which embodiments disclosed herein may be implemented for advantage.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

A thorough description of MRI principles is unnecessary for an understanding of the subject matter of the present disclosure by those skilled in the art. Nevertheless, a brief description of the physical principles involved in MRI is set forth below.

Magnetic resonance imaging (MRI) is an imaging technique to internally visualize the human body or other living organisms. MRI is based on the principles of nuclear magnetic resonance (NMR). In the early development of MRI, MRI mechanisms provided tomographic imaging. Modern MRI system have advanced well beyond tomographic imaging and typically provide volume imaging.

In general, MRI is a diagnostic method for providing detailed specimen images through manipulation of atomic nuclei, specifically hydrogen, within the specimen. A fundamental property of individual nuclear particles is that the particles spin or rotate about their own respective axes. As is well understood, a spinning charged particle produces a magnetic moment directed along that particle's axis of rotation. Hydrogen atoms lend themselves particularly well for MRI because a hydrogen nucleus has a single proton with a relatively large magnetic moment. These spinning nuclei and their resulting moments are randomly oriented in the absence of any external magnetic fields. By application of a strong magnetic field, the rotating nuclei have a strong tendency to align with the magnetic field, either in parallel or in opposition to the magnetic field. Nuclei aligned in opposition to the magnetic field have a higher energy than those nuclei that are aligned in parallel with the field. A small majority of nuclei will generally align in the lower energy state, i.e., in parallel, than opposed to the same field, typically only measuring in parts per million for the excess. By the addition of energy, e.g., by application of radio frequency (RF) pulses, to the excess nuclei, these nuclei are transitioned to align themselves antiparallel or in opposition to the magnetic field. As is understood in the art, it is the realigned nuclei that ultimately provide the information used to generate an MRI image.

While the respective nuclei are generally aligned with the applied magnetic field, it should be understood that this alignment is not precisely with a plane parallel to the axis of the magnetic field. Instead, the nuclear moments align at a slight angle from the axis of the magnetic field and precess about this axis. This frequency of precession, along with the magnetic moment caused by the alignment of the nuclei, comprise the phenomenon on which imaging by magnetic resonance is based.

The frequency of this atomic or nucleic precession, also referred to as the Larmor frequency, is a function of the specific nucleus and the strength of the external magnetic field. The nuclei will absorb energy and induce a signal in adjacent RF receptor coils only at the particle's Larmor frequency—an event referred to as resonance. In other words, by applying energy to the specimen at the Larmor frequency, the net magnetic moment of the excess nuclei may be reversed, or deflected, to the opposite or antiparallel direction by causing these parallel state particles to elevate to the higher energy state. The radiofrequency energy pulses applied are referred to as "excitation pulses." The duration of the RF pulse specifies the duration of the nuclear moment deflection. When the excitation pulse is removed, the nuclei will then begin to lose energy, causing the net magnetic moment to return to its original, lower energy state orientation, and the energies emitted during this transmission are used to create the image of the specimen.

Present day MRI devices generally scan only hydrogen atoms. The hydrogen atom is most attractive for scanning since it comprises the largest atomic percentage within the human body and provides the largest magnetic resonance (MR) signal respective to other elements present in human organs. As described hereinabove, every nuclear particle spins about its axis and the individual properties of the spin are defined by the specific nuclear particle in question, e.g., hydrogen, creating a magnetic moment with a defined magnitude and direction. The MR signal comprises a complex function dependent upon the concentration of the deflected hydrogen atoms, spin-lattice relaxation time, spin-spin relaxation time, motion within the sample and other factors as is understood in the art. Another component of the MR signal comprises the particular series of RF and magnetic field gradient pulses employed in the form of pulse sequences.

FIG. 1 is a diagrammatic representation of an exemplary magnetic resonance imaging system 100 in which embodiments disclosed herein may be implemented for advantage.

Operation of system 100 may be controlled from an operator console 10 which may include a computer 12 or other data processing system, an input apparatus 14, such as a keyboard, pointer device, joystick, track ball, touch screen or pad, or another suitable input apparatus. Input apparatus 14 may be used for interactive image analysis. Operator console 10 may include a control panel 16 and a display device 18.

Console 10 may be communicatively coupled with a computer system 20 that enables an operator to control the production and display of images on display device 18. Computer system 20 may include various modules adapted to communicate with one another, e.g., through an internal bus or other interconnect. In the illustrative example, computer system 20 includes an image processor module 22, a memory module 24, and a central processing unit (CPU) module 26. Memory module 24 may comprise a frame buffer for storing image data arrays. Computer system 20 may be linked to a storage device 28, such as a magnetic disk drive, tape drive, or other suitable media, for storage of image data and programs, and may communicate with a separate MRI system controller 30 through a communication link, such as a high speed serial link.

MRI system controller 30 may include a CPU module 32 and a pulse generator module 34 which connects to operator console 10, e.g., through a serial link or other suitable communication channel 40. MRI system controller 30 may additionally include a transceiver 36, a memory module 38, and an array processor 40. Operator console 10 may communicate commands to MRI system controller 30 that specify or define a particular scan sequence that is to be performed. Pulse generator module 34 operates the system components to carry out the desired scan sequence and produces data which indicates the timing, strength and shape of the RF pulses produced, and the timing and length of the data acquisition window. Pulse generator module 34 may connect to a set of gradient amplifiers 50 to indicate the timing and shape of the gradient pulses that are produced during the scan. Pulse generator module 34 may also receive patient data from a physiological acquisition controller 52 that may receive signals, such as electrocardiogram (ECG) signals from electrodes, from a number of different sensors connected to a specimen or patient. Pulse generator module 34 may connect to a scan room interface circuit 54 which may receive signals from various sensors associated with the condition of the patient and the magnet system. Additionally, scan room interface circuit 54 may facilitate transmission of positioning commands to a patient positioning system 56 to move the patient or specimen to the desired position for the scan.

The gradient waveforms produced by pulse generator module 34 may be applied to gradient amplifier system 50 having $G_x$, $G_y$, and $G_z$, amplifiers $50x$-$50z$. Each gradient amplifier excites a corresponding physical gradient coil located in an MRI system 70 that comprises a magnet assembly 72. In the illustrative example, each gradient amplifier $50x$-$50z$ excites a corresponding physical gradient coil of a gradient coil assembly 74 to produce the magnetic field gradients used for spatially encoding acquired signals. Gradient coil assembly 74 forms part of magnet assembly 72 which includes a polarizing magnet 76 and a whole-body radio frequency (RF) coil 78. Transceiver module 36 in MRI system controller 30 produces pulses which are amplified by an RF amplifier 58 and coupled to RF coil 78 by a transmit/receive switch 60. The resulting signals emitted by the excited nuclei in specimen 90 may be sensed by RF coil 78 and coupled through the transmit/receive switch 60 to a preamplifier 62. The amplified MR signals may then be demodulated, filtered, and digitized in a receiver section of transceiver 36. Transmit/receive switch 60 is controlled by a signal from pulse generator module 34 to electrically connect RF amplifier 58 to RF coil 78 during the transmit mode and to connect preamplifier 62 to RF coil 78 during the receive mode. Transmit/receive switch 60 may also enable a separate RF coil, such as a surface coil, to be used in either the transmit or receive mode.

The MR signals induced in RF coil 78 are digitized by transceiver module 36 and transferred to memory module 38 in MRI system controller 30. A scan is complete when an array of raw k-space data has been acquired in memory module 38. This raw k-space data is rearranged into separate k-space data arrays for each image to be reconstructed, and each of these is input to an array processor 40 which operates to Fourier transform the data into an array of image data. This image data may be conveyed to computer system 20 where it may be written to storage device 28, e.g., in a Digital Imaging and Communications in Medicine (DICOM) formatted file. In response to commands received from operator console 10, this image data may be archived in long term storage or it may be further processed by image processor 22, conveyed to operator console 10, and presented on display device 18. The image data, such as that stored in a DICOM file, may be submitted to post-processing techniques implemented in accordance with embodiments described herein.

Figure 2:
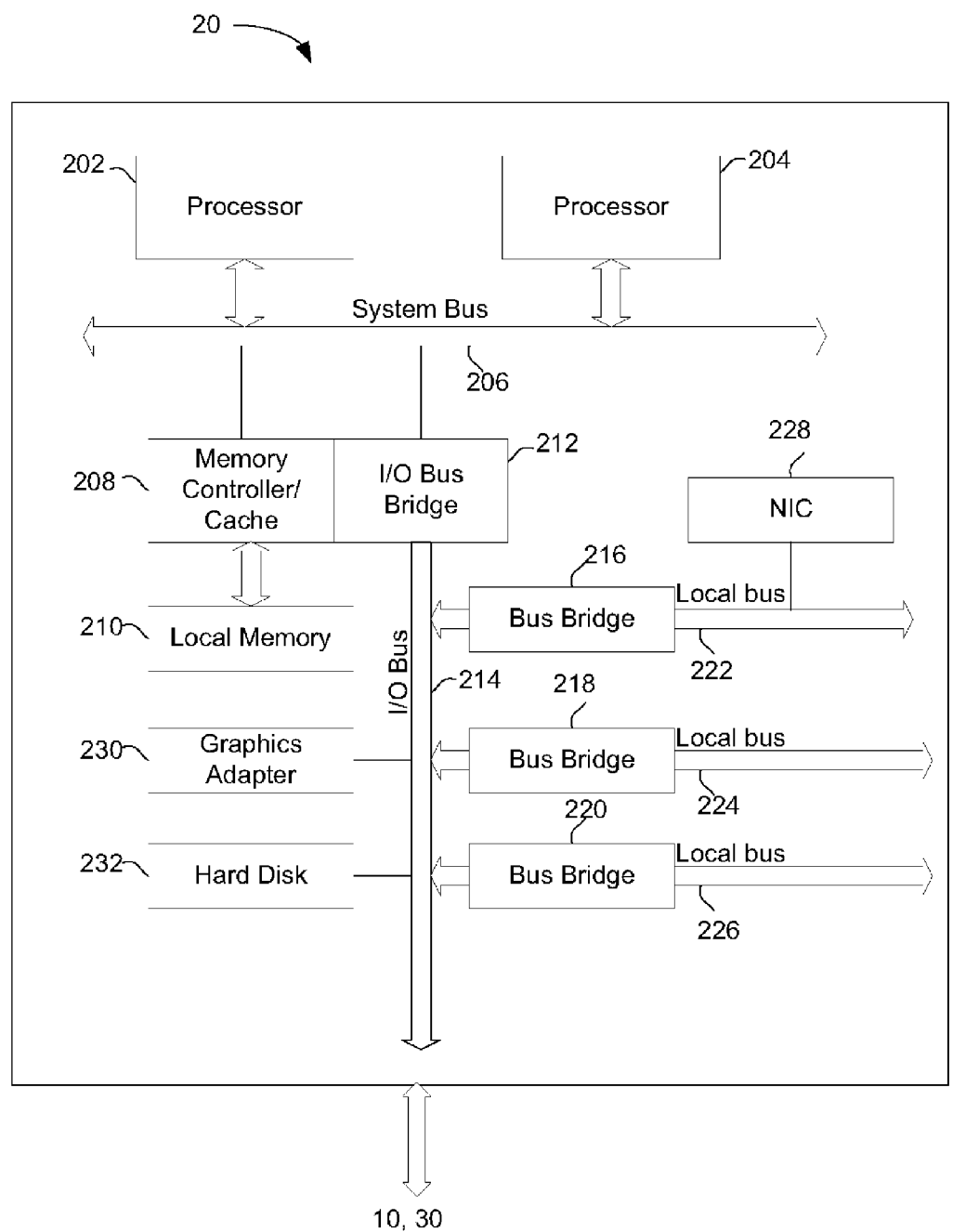
FIG. 2 is a diagrammatic representation of an exemplary embodiment of a computer system that may be deployed in the system of FIG. 1.

FIG. 2 is a diagrammatic representation of an exemplary embodiment of computer system 20 depicted in FIG. 1. Code or instructions implementing MRI processing embodiments disclosed herein may be located or accessed by computer system 20.

System 20 may be implemented as a symmetric multiprocessor (SMP) system that includes a plurality of processors 202 and 204 connected to a system bus 206, although other single-processor or multi-processor configurations may be suitably substituted therefor. A memory controller/cache 208 that provides an interface to local memory 210 may also be connected with system bus 206. An I/O bus bridge 212 may connect with system bus 206 and provide an interface to an I/O bus 214. Memory controller/cache 208 and I/O bus bridge 212 may be integrated into a common component.

A bus bridge 216, such as a Peripheral Component Interconnect (PCI) bus bridge, may connect with I/O bus 214 and provide an interface to a local bus 222, such as a PCI local bus. Communication links to other network nodes of system 100 in FIG. 1 may be provided through a network interface card (NIC) 228 connected to local bus 222 through add-in connectors. Additional bus bridges 218 and 220 may provide interfaces for additional local buses 224 and 226 from which peripheral or expansion devices may be supported. A graphics adapter 230 and hard disk 232 may also be connected to I/O bus 214 as depicted.

An operating system may run on processor system 202 or 204 and may be used to coordinate and provide control of various components within system 20. Instructions for the operating system and applications or programs are located on storage devices, such as hard disk drive 232, and may be loaded into memory 210 for execution by processor system 202 and 204.

Those of ordinary skill in the art will appreciate that the hardware depicted in FIG. 2 may vary. The depicted example is not intended to imply architectural limitations with respect to implementations of the present disclosure.

FIG. 3A is a diagrammatic representation of an embodiment of a software configuration 300 of computer system 20 depicted in FIGS. 1 and 2 that facilitates MRI data post-processing in accordance with embodiments disclosed herein. Configuration 300 includes an operating system 302 that manages system hardware and execution of various system applications. Configuration 300 may include a network stack 304 managed by operating system 302 that provides for network communications. For example, network stack 304 may be implemented as a transmission control protocol/Internet protocol (TCP/IP) stack. An MRI post processing application 306 may be run that facilitates manipulation or processing of acquired MRI data. MRI post-processing application 306 may receive acquired data and store the acquired MRI data. In a particular implementation, MRI data may be received by post-processing application 306 and formatted according to the DICOM standard. To this end, post-processing application 306 may interface with a file service 308 that provides for independence from the underlying media format and physical media and that provides functionality for storing acquired MRI data in a DICOM file 310 and accessing DICOM file content therefrom. Additionally, configuration 300 may include information object definitions 312 that define information object classes, such as object descriptions and attributes, and service class specifications 314 that specify the semantics of commands and associated data. A graphics package 316 may be included in configuration 300. Graphics package 316 may be implemented as, for example, an instance of OpenGL, and may include one or more imaging applications, such as ImageJ 318, jogl 320, or other suitable applications, for viewing, manipulating, or otherwise processing imaging data, such as DICOM file 310. In accordance with an embodiment, a diffusion anisotropy module 322 is interfaced with imaging package 316. For example, diffusion anisotropy (DA) module 322 may be implemented as a plug-in to imaging package 316. In one implementation, diffusion anisotropy module 322 is adapted to calculate directional anisotropy (DA) data from imaging data, such as DICOM file 310, as described more fully hereinbelow, and in a manner that provides improved imaging results for various imaging situations. In another embodiment, diffusion anisotropy module 322 may be adapted to calculate an average vector (AV) for voxels of acquired image data. As is known, a voxel is a volume element representing a value on a regular grid in three-dimensional space and is analogous to a pixel in two-dimensional space. In this implementation, a main, or maximum, diffusion direction having the maximum diffusivity is identified from all the directions where the diffusion constant has been measured, and components of the diffusion coefficients for all other direction are calculated along the maximum diffusion direction. A particular number of the diffusion directions having the largest diffusion coefficient projection along the maximum direction may be averaged and the results may be imaged as described more fully hereinbelow with regard to FIGS. 12-15.

FIG. 3B is a diagrammatic representation of an embodiment of a diffusion anisotropy module 322 implemented in accordance with an embodiment. As noted above, diffusion anisotropy module 322 may be implemented as a plug-in to ImageJ 318 and/or jogl 320, and thus may include an interface 322a therewith.

Diffusion anisotropy module 322 may include a directional anisotropy module 322b adapted to calculate directional anisotropy (DA) values directly from the original MRI image data to characterize the diffusion anisotropy in each voxel. In an embodiment, the DA values are calculated from each of the diffusion coefficients, pi, at the different diffusion gradient directions sampled during the MR DTI acquisition for each image voxel. The DA values calculated by directional anisotropy module 322b may then be communicated to graphics package 316, e.g., ImageJ 318, and imaged thereby. Image characteristics exhibited by images obtained from graphics processing of DA values calculated in accordance with embodiments disclosed herein have provided unexpected results that may advantageously provide visual depiction of directional anisotropy characteristics not provided by conventional post-processing mechanisms.

Diffusion anisotropy module 322 may include an average vector module 322c adapted to calculate AV values directly from the original MRI image data to characterize the directionality of diffusion in each voxel. Average vector module 322c may be adapted to identify a diffusion direction having the maximum diffusivity of all directions where the diffusion constant has been measured and may calculate components or projections of the diffusion coefficients for all other directions along the maximum diffusion direction. A particular number of the diffusion directions having the largest diffusion coefficient projection along the maximum direction may be averaged and the results may be imaged. Characteristics exhibited by images obtained from AV post-processing techniques implemented in accordance with embodiments disclosed herein have provided unexpected results that may advantageously provide visual depiction of directional diffusion characteristics not provided by conventional post-processing mechanisms. In particular, AV post-processing techniques that may be performed by average vector module 322c have provided unexpected results when applied to white matter fiber tracking.

FIGS. 1-3B are intended as examples, and not as architectural limitations, of system, computer, and software configurations in which embodiments disclosed herein may be implemented. The particular system, computer architecture, and software configurations shown and described are illustrative and are chosen only to facilitate an understanding of the disclosed embodiments.

In recent years, magnetic resonance diffusion tensor imaging (DTI) has been established as an imaging method to investigate white matter tracts in the brain and in the spinal cord. Included in this method is the acquisition of images of the anatomy to be investigated with an MRI pulse sequence which is sensitized to the diffusion of water. This pulse sequence is in most cases derived from the so-called pulsed gradient spin echo (PGSE) sequence, sometimes also called Stejskal and Tanner pulse sequence after its inventors. The rationale behind this approach is founded in the restricted water diffusion perpendicular to the white matter tracts but not along them. This results in different diffusion coefficients for different directions.

The conventional method to analyze MRI images acquired with the MRI diffusion sequence comprises calculating the elements of the so-called diffusion tensor. FIG. 4 is a diagrammatic representation of an exemplary diffusion tensor 400. Tensor 400 comprises a symmetric 3×3 matrix that describes anisotropic diffusion in three perpendicular directions. Tensor 400 has its roots in the study of molecular diffusion in solid state materials which exhibit a high degree of symmetry when in the crystalline state. Tensor 400 describes mobility along each of the three Cartesian x, y, and z directions, and the correlation between the directions. For example, elements 410a-410c specify the mobility in the x-direction and the correlation of the mobility in the x-direction and the y- and z-directions. In a similar manner, elements 411a-411c and 412a-412c describe the mobility in the y- and z-directions and the correlation between the x and z, and x and y directions, respectively.

The results of the DTI analysis yield an image describing the asymmetry of diffusion in each voxel, that is the smallest volume element that can be resolved, and directional information. With regard to the image describing the asymmetry of diffusion in each voxel, a high grayscale intensity may be associated with high asymmetry and consequently a low gray scale intensity may be associated with low asymmetry or isotropic diffusion. Mathematically, this is typically expressed by a quantity called fractional anisotropy (FA) calculated from the original acquired MR DTI images. This quantity ranges from 0, that is isotropic, to 1, the highest anisotropy. Calculation of the FA for each image voxel of the acquired image data may be made according to the following:

$$FA = \frac{\sqrt{3((\lambda_1 - \lambda)^2 + (\lambda_2 - \lambda)^2 + (\lambda_3 - \lambda)^2)}}{\sqrt{2(\lambda_1^2 + \lambda_2^2 + \lambda_3^2)}} \quad \text{eq. 1}$$

In this equation, $\lambda$ is the average diffusion coefficient calculated from:

$$\lambda = \frac{\lambda_1 + \lambda_2 + \lambda_3}{3} \quad \text{eq. 2}$$

where $\lambda_1$, $\lambda_2$ and $\lambda_3$ are the diffusion coefficients along the principal directions calculated with the diffusion tensor method. A conventional magnetic resonance DTI image may then be generated from the FA values calculated for each voxel, e.g., by submission of the FA voxel values to an imaging application such as ImageJ 318.

The directional information obtained from a conventional DTI analysis includes information regarding the direction with the largest diffusion coefficient, the direction with the smallest diffusion coefficient perpendicular to the first direction, and a third direction with an intermediate diffusion coefficient perpendicular to both directions. This directional information may be visually depicted in a color-coded image. The color of each pixel may comprises a composite of the strength of diffusion in three directions: superior-inferior coded as blue, right-left coded as red and anterior-posterior coded as green, for example. In contemporary MRI post-processing systems, the direction with the largest diffusion coefficient is used to trace the path of white matter fiber bundles thereby providing the white matter fiber image. However, such a DTI imaging mechanism exhibits various limitations and deficiencies.

Contrary to crystalline materials, human tissue does not possess a high symmetry. Based on the scale of resolution, living tissue is highly asymmetric. The size of white matter fiber bundles are in the order of μm whereas the voxel size of MR DTI images, that is the image resolution, is in the order of mm, thus averaging the signal from the water diffusion along the fiber bundles in each voxel over three orders of magnitude. Some of the voxels will therefore contain several fiber bundles at different directions. This situation is also sometimes referred to as having crossing fibers in the voxel. The angle between two crossing fiber bundles may have any value and will only be 90 degrees by chance. Thus, only by coincidence do the directions calculated by the tensor analysis correspond with the directions of the fiber bundles. In any other case, the tensor analysis can only provide the direction of maximum diffusion as the best approximation of the diffusion tensor analysis to the measured diffusion coefficients in each direction, not necessarily the direction of each fiber bundle. Mathematically, this also corresponds to the best fit of an ellipsoid to the measured directional diffusion coefficient information.

Because the fractional anisotropy is derived from the tensor analysis, it exhibits the deficiencies of the tensor model applied to human tissue, particularly reliance on analysis of the tensor in three orthogonal directions. Moreover, as conventional fiber tracking algorithms currently rely on the maximum direction of diffusion, they are disadvantageously effected by the approximate nature of conventional DTI analysis.

In accordance with embodiments disclosed herein, an analysis procedure applicable in a clinical setting is provided. Disclosed embodiments do not rely on the DTI analysis to calculate diffusion anisotropy values in each MRI voxel. Additionally, the concept of a three-dimensional (3D) diffusion profile is introduced which can be used to visualize fiber crossing in an MRI voxel. In a particular implementation, a post-processing technique is provided that analyzes image data acquired with an MR DTI pulse sequence. However, rather than calculating the FA based on the results of the tensor analysis, a quantity, referred to herein as directional anisotropy (DA), is derived directly from the original MRI image data to characterize the diffusion anisotropy in each voxel.

In an exemplary embodiment, calculation of the DA does not involve the results of the diffusion tensor analysis, but rather DA values are directly calculated from each of the diffusion coefficients at the different diffusion gradient directions sampled during the MR DTI acquisition for each image voxel. Modern MRI systems may provide, for example, 15 diffusion gradient directions at each image point, although high-end research MRI systems may provide for 256 diffusion directions. In the examples provided herein, calculation of DA values is assumed to be made on an MRI system using 15 diffusion gradient directions. Thus, in implementations provided in accordance with an exemplary embodiment, DA post processing operates on diffusion coefficients of 15 directions, while conventional FA post processing provides imaging data based on 3 tensor directions. As will be evident more fully hereinbelow, techniques described herein for DA post processing provides for enhanced image resolution compared with traditional FA post processing.

Figure 5:
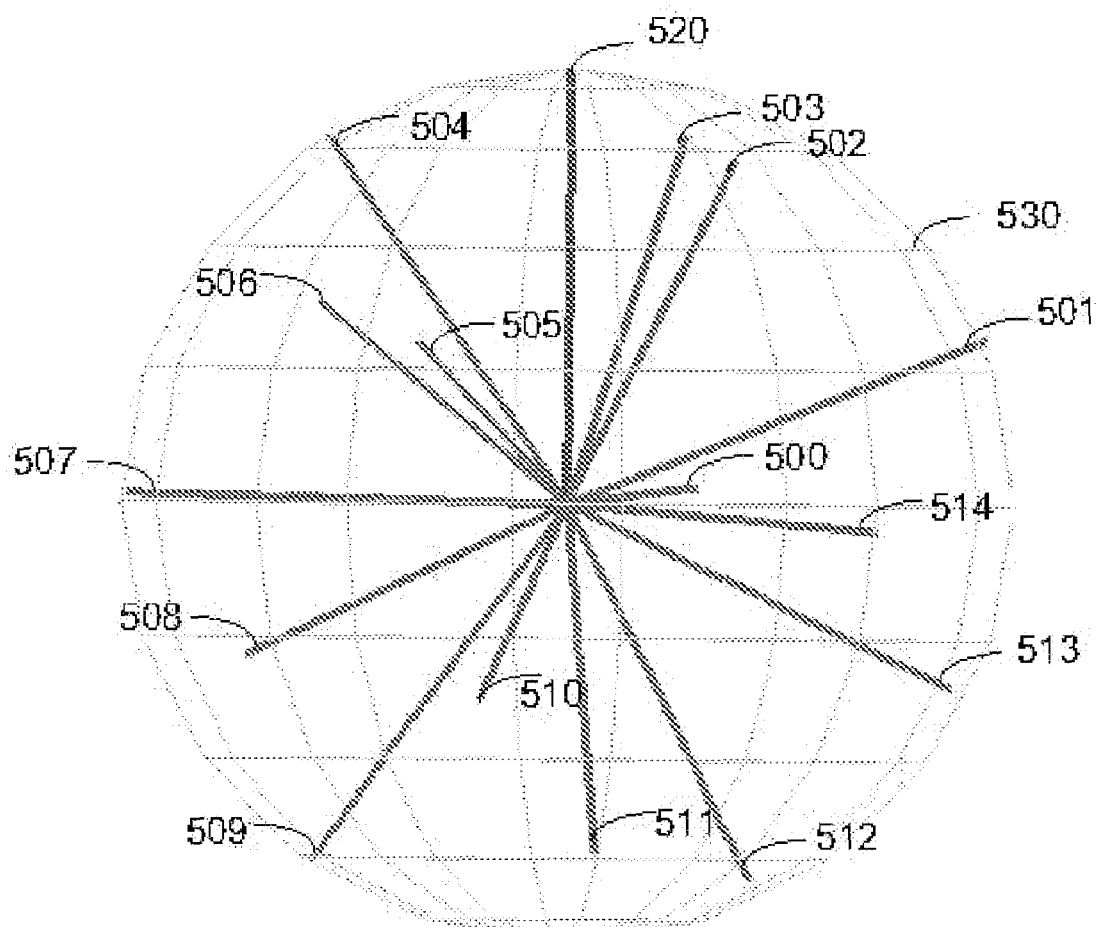
FIG. 5 is a diagrammatic representation of fifteen different diffusion gradient directions along which directional anisotropy imaging data presented in this disclosure was obtained in accordance with embodiments disclosed herein.

FIG. 5 depicts a diagrammatic illustration of fifteen different diffusion gradient directions along which imaging data presented in this disclosure was obtained in accordance with embodiments disclosed herein. Implementations presented herein are not limited to a particular number of diffusion gradient directions. However, the accuracy or resolution may increase with a corresponding increase in the number of the diffusion gradient directions. As depicted in FIG. 5, fifteen diffusion gradient directions 500, 501, 502, 503, 504, 505, 506, 507, 508, 509, 510, 511, 512, 513, and 514 for the MR DTI acquisition are used to create images depicted herein. The z direction 520 corresponding to the direction along the long axis 80 of the magnet depicted in FIG. 1 and also the direction of the main magnetic field is shown in black. A wireframe sphere 530 is illustratively depicted to facilitate visualization of the three-dimensionality of the graph.

In an exemplary embodiment, the DA is calculated according to the following:

$$DA = \frac{\sqrt{N_{directions} \cdot \sum_{i=1}^{N_{directions}} (\mu_i - \mu)^2}}{\sqrt{(N_{directions} - 1) \cdot \sum_{i=1}^{N_{directions}} \mu_i^2}} \quad \text{eq. 3}$$

where $\mu$ is the diffusion coefficient averaged over all the diffusion gradient directions 500, 501, 502, 503, 504, 505, 506, 507, 508, 509, 510, 511, 512, 513, and 514 according to the following:

$$\mu = \frac{1}{N_{directions}} \sum_{i=1}^{N_{directions}} \mu_i \quad \text{eq. 4}$$

and where $\mu_i$ is a value of the diffusion coefficient at a respective diffusion gradient direction 500, 501, 502, 503, 504, 505, 506, 507, 508, 509, 510, 511, 512, 513, and 514. Thus, a DA value may be calculated for each acquired image voxel according to equations 3 and 4, and the calculated DA values may then be used for generating an image, e.g., by an imaging application such as ImageJ 318. Production of an image from DA values calculated in accordance with an embodiment has provided unexpected results that provide particular advantage over conventional imaging post-processing routines as described more fully hereinbelow. Particularly, DA values calculated from the acquired image data provide an imaging mechanism that accounts for the diffusion coefficient in each diffusion gradient direction rather than the three tensor directions as obtained in conventional MR DTI routines.

Figure 6:
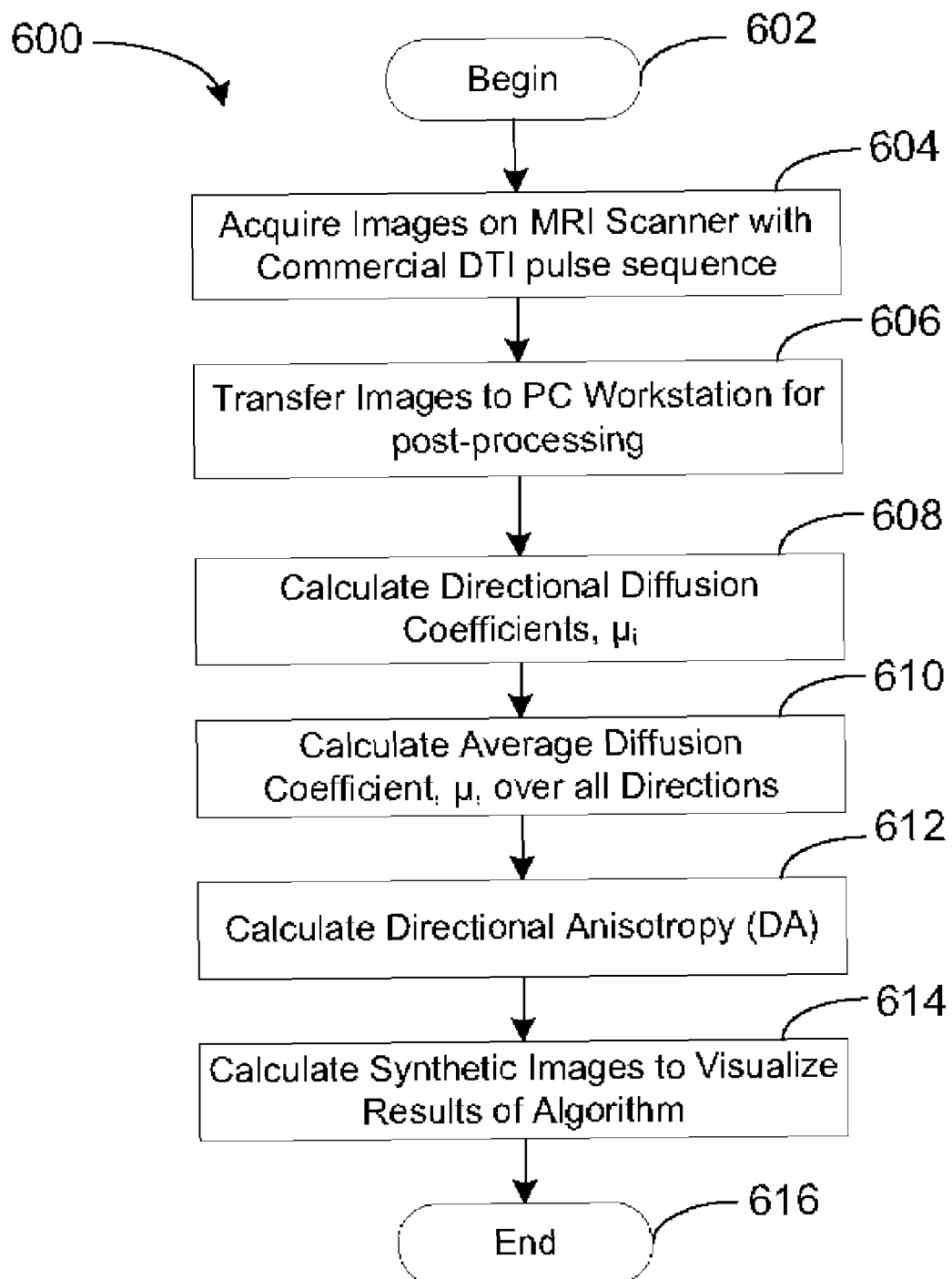
FIG. 6 depicts a flowchart of a magnetic resonance image processing routine implemented in accordance with embodiments disclosed herein.

FIG. 6 depicts a flowchart 600 of an MRI processing routine implemented in accordance with embodiments disclosed herein. The processing routine is invoked at step 602, and images of a specimen are acquired at step 604, for example by application of a commercial DTI pulse sequence in MRI system 100. At step 606, the acquired images may then be transferred to a workstation, such as computer system 20 depicted in FIG. 1, for post processing, e.g., in the form of a DICOM file.

Directional diffusion coefficients, $\mu_i$, may then be calculated on each pixel element, e.g., on each voxel, of the acquired image data at step 608 for each diffusion gradient direction. An average diffusion coefficient, $\mu$, may then be calculated over all directions for each voxel at step 610 in accordance with equation 4 described above. A directional anisotropy (DA) value may then be calculated for each pixel element at step 612 according to equation 3 described above. Synthetic images based on, at least in part, the DA values calculated for each pixel element may then be calculated to visualize the results of the MRI post processing routine at step 614, e.g., by submission of the calculated DA values to an imaging application such as lmageJ. The MRI processing routine may then end at step 616. Images generated from DA values calculated in accordance with the disclosed embodiments provide visual characteristics that were unexpected and that provide advantages over images generated with conventional FA calculations.

Figure 7B:
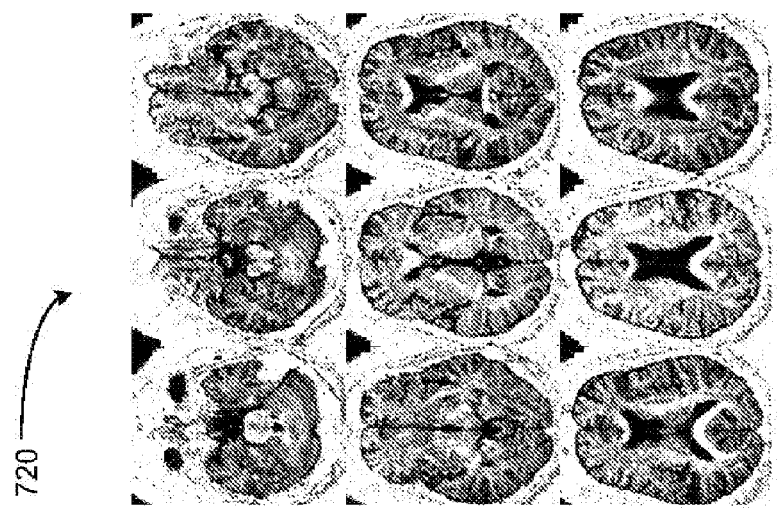
FIG. 7B depicts selected axial slice images generated from an embodiment of directional anisotropy calculations from the same brain acquisition data from which the diffusion tensor images of FIG. 6A were generated.
Figure 7A:
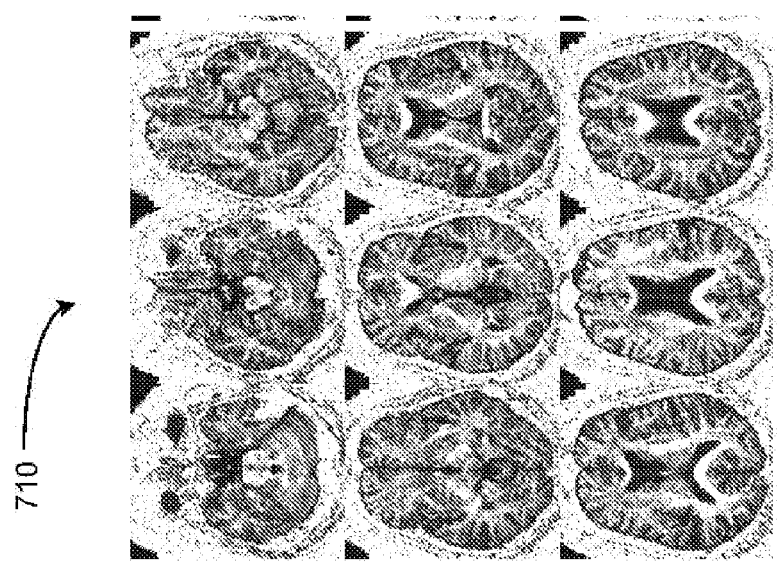
FIG. 7A depicts selected axial slice images generated from magnetic resonance diffusion tensor imaging of brain acquisition data based on conventional fractional anisotropy calculations.

FIG. 7A depicts exemplary selected axial slice images 710 generated from MR DTI brain acquisition data based on conventional FA calculations, and FIG. 7B depicts selected exemplary axial slice images 720 generated from the same MR DTI brain acquisition data based on DA calculations derived from equations 3 and 4 described above. Because the DA data utilized for calculation of images 720 uses all of the diffusion gradient directions, enhanced resolution is obtained compared to images 310 obtained from conventional FA calculations.

To better demonstrate the enhanced imaging obtained by DA post-processing as described herein, reference is now made to FIGS. 8A-8C. FIG. 8A depicts an exemplary difference image 800 that exhibits image features not visible in FA images 810 or DA images 820 alone. Difference images 800 was derived from FA image 710 and DA image 720 depicted in FIGS. 7A and 7B by subtracting, on a voxel-by-voxel basis, the DA value for a voxel of image 720 from a corresponding FA voxel value calculated for FA image 710. The differences, FA-DA, for each voxel were then imaged, e.g., by graphics package 316. In the exemplary embodiment, difference image 800 has been generated as a gray-scale image. FIG. 8B depicts a color-coded difference image 810 derived from difference image 800 by displaying, on a voxel-by-voxel basis, the voxel value, FA-DA, with negative difference values shown in red. As depicted, FA values calculated for brain white matter are generally larger than DA values as exhibited in color-coded difference image 810. FIG. 8C depicts a ratio image 820 derived from a ratio of FA-to-DA calculations on a voxel-by-voxel basis. FIGS. 8A-8C clearly demonstrate that imaging data obtained from DA calculations provide for enhanced visual imaging. This was an unexpected result.

In accordance with another embodiment, mechanisms for generating a 3D diffusion profile that facilitates visualization of directional characteristics of MR DTI image data are provided. In one implementation, 3D diffusion profiles may be generated using one or more applications of graphics package 316, e.g., OpenGL. In this implementation, 3D objects may be created to visually depict the directional characteristics of the MRI DTI data by graphically processing DA data generated in accordance with embodiments disclosed herein.

Figure 9A:
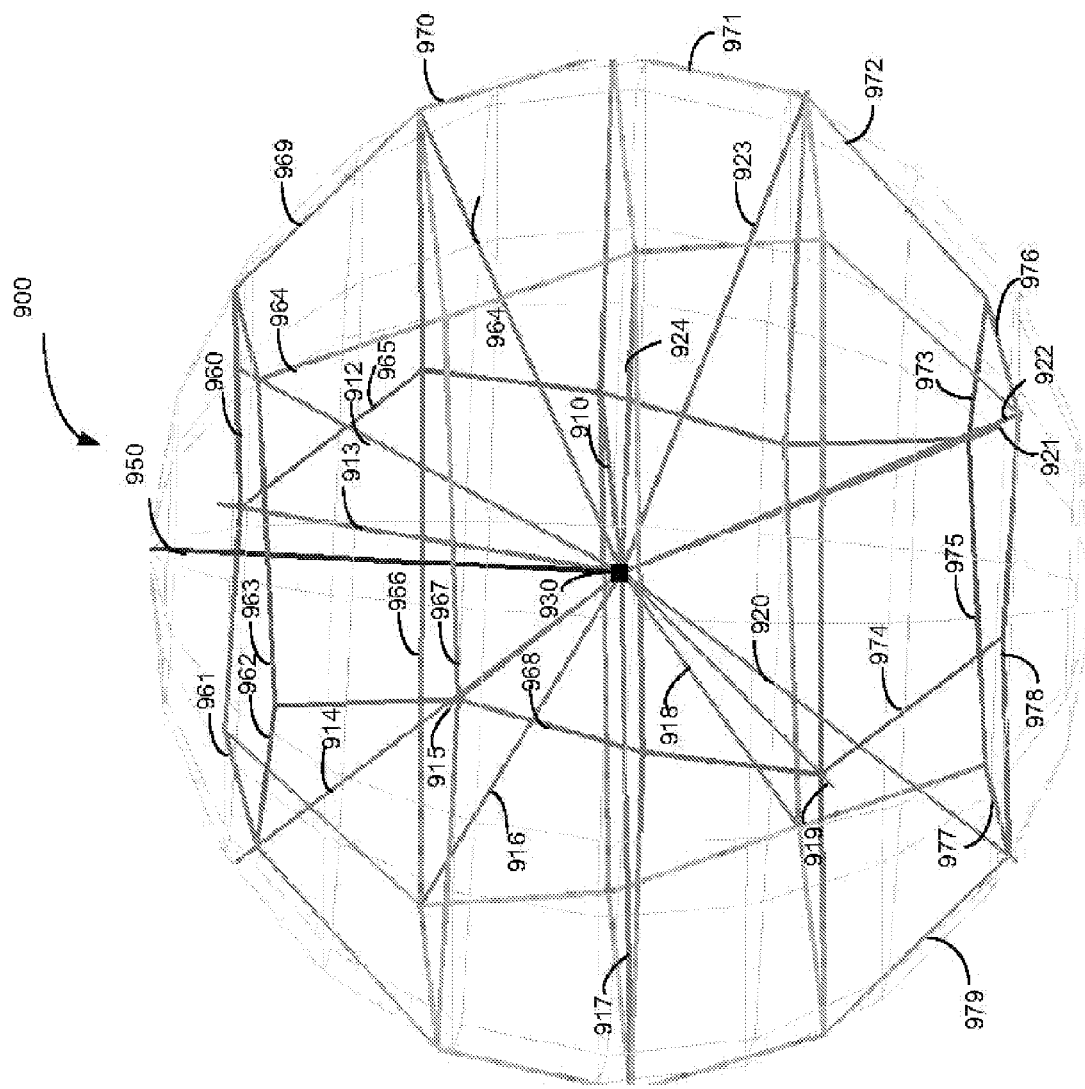
FIGS. 9A and 9B depict a diagrammatic respective representation of a 3D diffusion profile that depicts directional characteristics of magnetic resonance diffusion tensor imaging data in accordance with an embodiment.
Figure 9B:
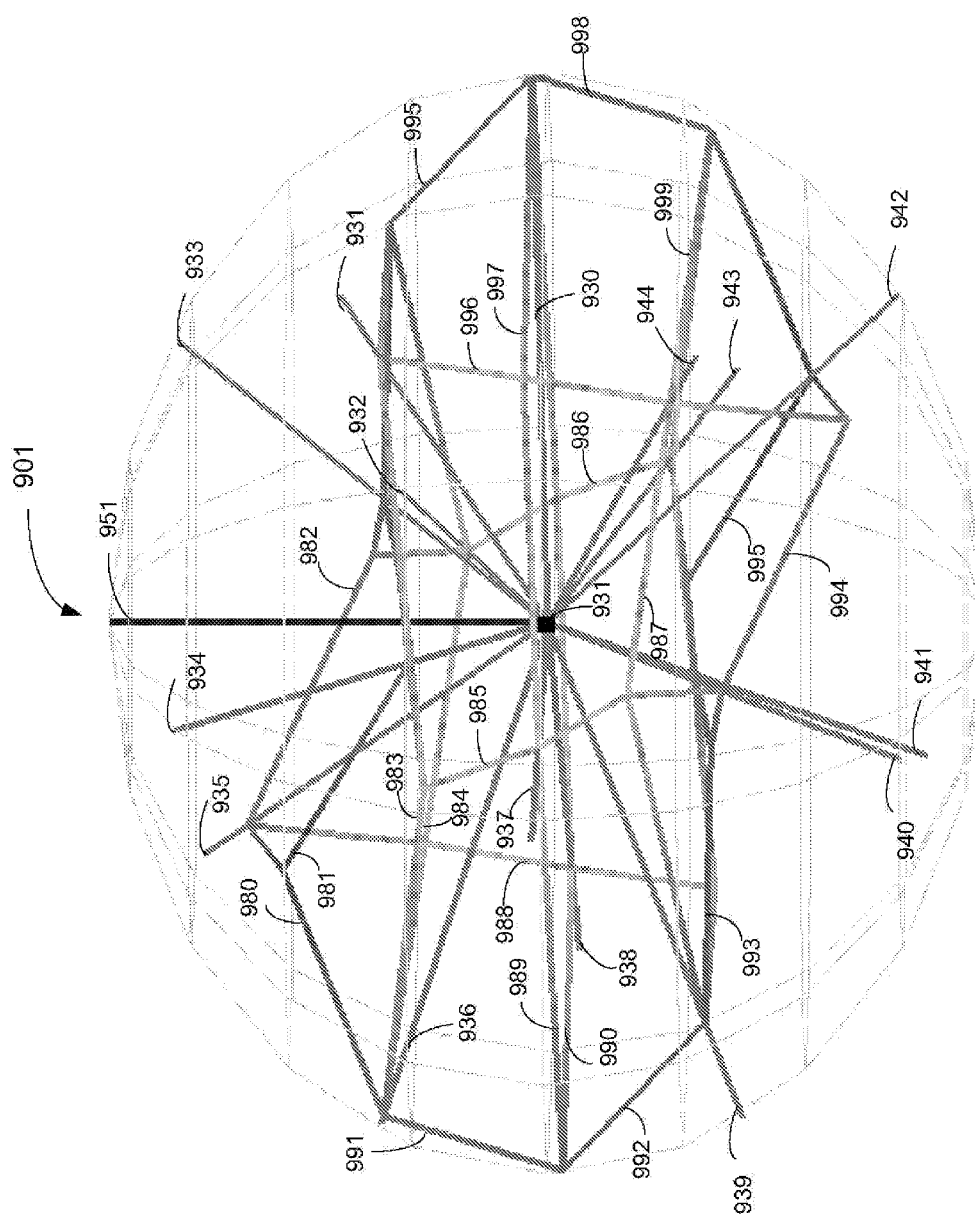

FIGS. 9A and 9B depict a respective diagrammatic representation of a 3D diffusion profile 900 and 901 that depict directional characteristics of exemplary MR DTI data in accordance with the present exemplary embodiments. Particularly, diffusion profiles 900 and 901 depict directional characteristics of the MR DTI data along each of the fifteen diffusion gradient directions 910, 911, 912, 913, 914, 915, 916, 917, 918, 919, 920, 921, 922, 923, and 924 and 930, 931, 932, 933, 934, 935, 936, 937, 938, 939, 940, 941, 942, 943, and 944. In the particular implementation depicted, the values of the diffusion constant for each direction 910, 911, 912, 913, 914, 915, 916, 917, 918, 919, 920, 921, 922, 923, and 924 and 930, 931, 932, 933, 934, 935, 936, 937, 938, 939, 940, 941, 942, 943, and 944 are depicted as nodes of a 3D line loop connected by color coded lines, such as lines 960, 961, 962, 963, 964, 965, 966, 967, 968, 969, 970, 971, 972, 973, 974, 975, 976, 977, 978, and 979 of profile 900 and lines 980, 981, 982, 983, 984, 985, 986, 987, 988, 989, 990, 991, 992, 993, 994, 995, 996, 997, 998, and 999 of profile 901 The values of the diffusion constants are indicated by the distance from the center 930 and 931 of respective profile 900 and 901, with larger distances indicating a larger value of the diffusion constant, $\mu_i$. In FIGS. 9A and 9B, the diffusion constant color codes include blue representing superior-inferior, red representing right-left, and green representing anterior-posterior. The z-direction 950 and 951 is marked by a blue line.

Profile 900 depicts an isotropic 3D diffusion profile with equal diffusion constants, $\mu_i$, in each direction. Profile 901 depicts a highly anisotropic diffusion profile as may be evident by the larger values of diffusion constants, $\mu_i$, in the right-left direction, as shown color coded in red, with respect to the diffusion constants in any other directions. For illustrative purposes, the line loop formed by lines 960, 961, 962, 963, 964, 965, 966, 967, 968, 969, 970, 971, 972, 973, 974, 975, 976, 977, 978, and 979 of profile 900 and lines 980, 981, 982, 983, 984, 985, 986, 987, 988, 989, 990, 991, 992, 993, 994, 995, 996, 997, 998, and 999 of profile 901 that mark the diffusion constants, $\mu_i$, have been extrapolated to negative gradient directions in the 3D diffusion profiles 900 and 901 to provide symmetry of the profiles 900 and 901 and in other 3D diffusion profiles depicted herein. A diffusion profile similar to those depicted in FIGS. 9A and 9B may be generated on a voxel-by-voxel basis, for example upon selection or specification by a technician or other system operator of a particular voxel of a displayed image. The diffusion profiles may be generated from DA calculations as described above.

Figure 10:
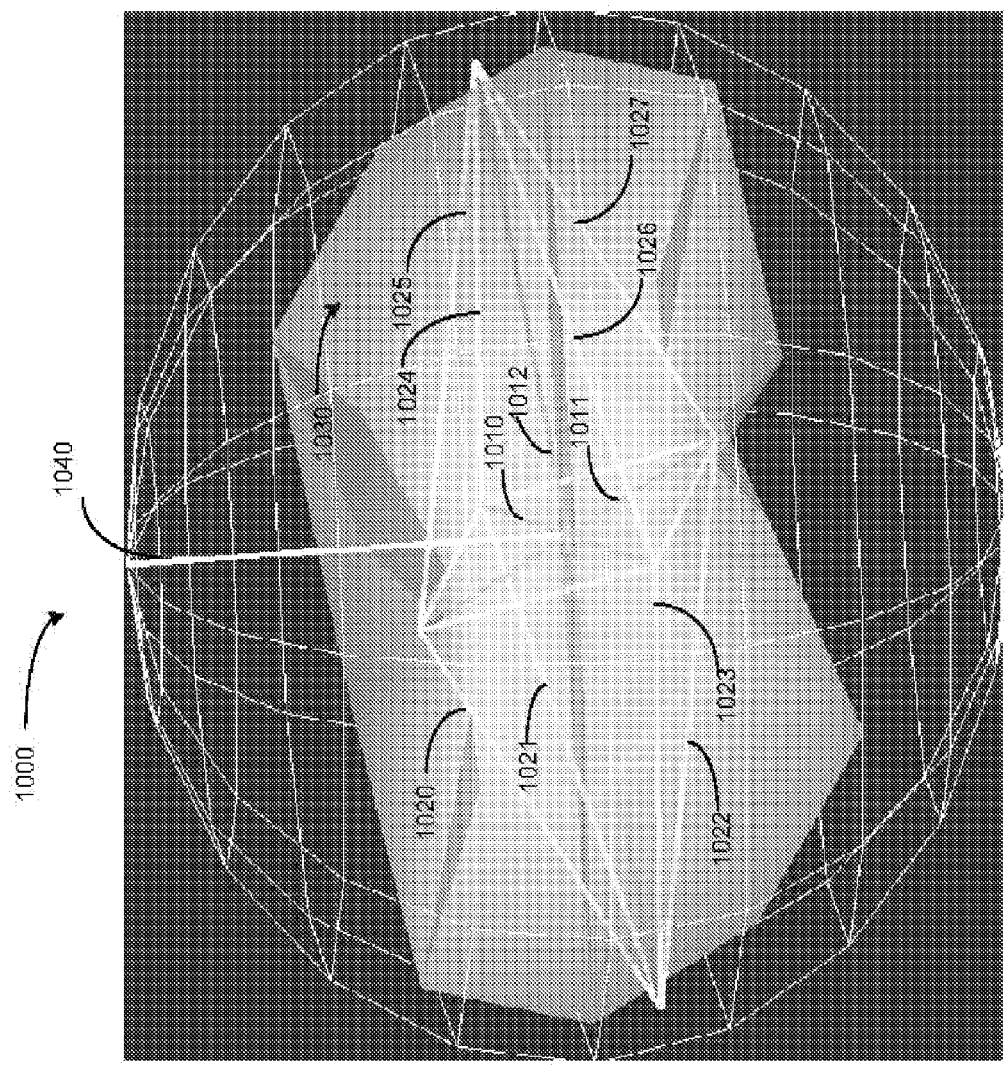
FIG. 10 depicts an embodiment of a final image generated from a diffusion profile generated from a 3D diffusion profile.

FIG. 10 depicts a final rendering or image 1000 generated from an exemplary diffusion profile, such as profile 901 depicted in FIG. 9B, in accordance with an exemplary embodiment. To compare the results of the traditional DTI analysis with the diffusion constants, $\mu_i$, measured at the different gradient directions 500, 501, 502, 503, 504, 505, 506, 507, 508, 509, 510, 511, 512, 513, and 514, the eigenvectors (A) calculated according to conventional methodologies are graphically depicted in image 1000 comprising straight lines 1010, 1011, and 1012 color coded by direction and connected by gray lines 1020, 1021, 1022, 1023, 1024, 1025, 1026, and 1027 while the diffusion constants, $\mu_i$, calculated in each of the gradient directions 500, 501, 502, 503, 504, 505, 506, 507, 508, 509, 510, 511, 512, 513, and 514 are presented as a color filled polygon 1030. Polygon 1030 may be generated from diffusion profile 901 depicted in FIG. 9B by replacing the line loop comprised of various lines 960, 961, 962, 963, 964, 965, 966, 967, 968, 969, 970, 971, 972, 973, 974, 975, 976, 977, 978, and 979 demarking the diffusion constants, $\mu_i$, by filled surfaces. In the exemplary embodiment, the background color has been depicted in black to enhance visualization of the profile characteristics. A line 1040 marking the z direction is depicted in white. As illustrated, the DA calculations from which polygon 1030 is formed provide a more robust visualization of directional information compared to the directional information obtained from the conventional calculation of eigenvectors designated with lines 1010, 1011, and 1012. The 3D diffusion profile depicted by image 1000 may be rotated by the user on display device 18 depicted in FIG. 1. An image depicting the diffusion profile similar to image 1000 may be generated for a particular voxel in response to a user selecting a pixel or image component of a displayed MRI image such as image 720 depicted in FIG. 7B.

FIG. 11A depicts an exemplary image 1110 generated from conventional FA calculations, e.g., according to equation 1, and FIG. 11B depicts an exemplary gray-scale image 1120 generated from DA calculations in accordance with embodiments disclosed herein, e.g., according to equations 3 and 4. For comparison of results obtained from conventional methodologies and those obtained in accordance with embodiments disclosed herein, image 1120 was generated from the same acquired image data as that used for generation of image 1110.

FIG. 11C depicts a difference image 1130 generated by subtracting the DA calculations used for generating image 1120 from corresponding FA calculations used for generating image 1110 and imaging the difference, e.g., by submitting the voxel difference between image 1110 and 1120 to an imaging application, such as imaging package 316, for generation of image 1130. For example, difference image 1130 may be generated by subtracting the DA calculation of a voxel from a corresponding FA calculation for the same voxel. This process may be repeated on a voxel-by-voxel basis for each voxel of the acquired image data, and each voxel difference may then be submitted to an imaging application that generates difference image 1130 thereby graphically imaging the difference between the imaging results obtained from traditional FA methodologies and those obtained by DA mechanisms implemented in accordance with exemplary embodiments.

FIG. 11D depicts an image 1140 comprising a color coding of the difference image 1130 depicted in FIG. 11C. For voxels of image 1130 having a difference, FA-DA, that is a positive value, the voxel is imaged in blue, and voxels of image 1130 having a difference, FA-DA, that is negative are imaged in red.

FIG. 11E depicts an exemplary color-coded image 1150 generated from DA calculations according to equation 3, that is image 1150 is a color-coded representation of grayscale image 1120 depicted in FIG. 11B. Colors of each pixel of image 1150 may comprise a composite of the strength of diffusion in three directions, for example superior-inferior coded as blue, right-left coded as red and anterior-posterior coded as green although other color imaging schemes may be substituted therefor.

Figure 11F:
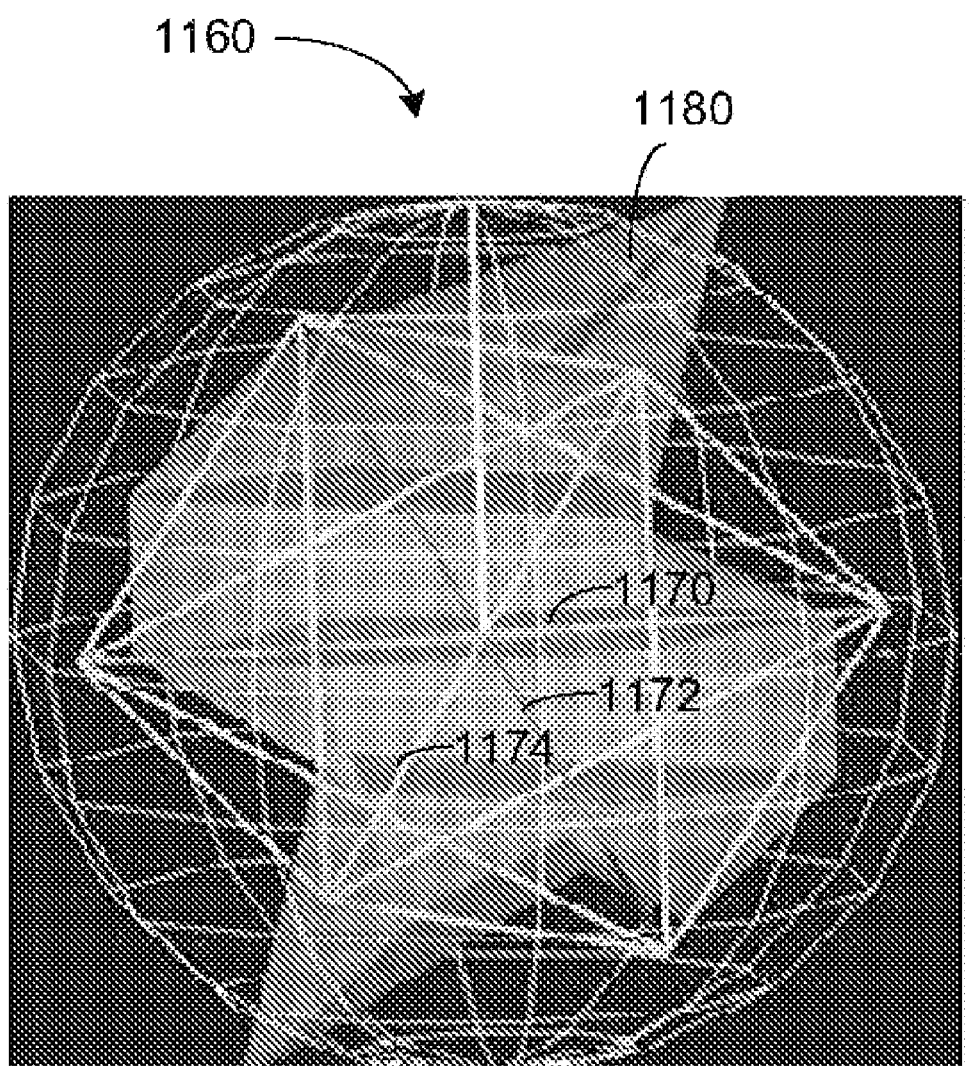

FIG. 11F depicts a 3D diffusion profile image 1160 for a selected region that reveals two major diffusion directions as graphically indicated in blue and red thereby providing a visual suggestion of a crossing of two fiber bundles. The traditional DTI analysis, as depicted by eigenvectors represented by lines 1170, 1172, and 1174 similar to those depicted in FIG. 10, result in three nearly equal diffusion coefficients along the three orthogonal directions resulting in an FA value of 0.11. The DA analysis results, graphically depicted by polygon 1180, in a DA value of 0.23 because it considers the differences in the diffusion constants, $\mu_i$, of the different gradient directions 500, 501, 502, 503, 504, 505, 506, 507, 508, 509, 510, 511, 512, 513, and 514 directly without an approximation through a DTI analysis. The FA-DA images 1130 and 1140 therefore have a conspicuous hypointense area at this location graphically designated with a red arrow in images 1130 and 1140.

Images 1110, 1120, 1130, 1140, 1150 and profile image 1160 were all calculated from the same exemplary MR DTI image data and thus provide a direct mechanism for visual distinction of imaging results obtained through conventional methodologies and those obtained in accordance with exemplary embodiments.

In another exemplary embodiment, the diffusion gradient direction with the largest diffusivity or diffusion coefficient value may be exploited for generating color-coded images that advantageously exhibit image characteristics not obtained with imaging techniques that rely on conventional diffusion tensor analysis. Instead of applying a processing algorithm for creating a color-coded image using the main eigenvector obtained from a conventional DTI analysis, the same algorithm may be applied to an average vector (AV) calculated in accordance with embodiments disclosed herein. In this implementation, a main, or maximum, diffusion direction having the maximum diffusivity is identified from all the directions where the diffusion constant has been measured. For example, assume fifteen different diffusion gradient directions 500, 501, 502, 503, 504, 505, 506, 507, 508, 509, 510, 511, 512, 513, and 514 depicted in FIG. 5 are sampled during an MR DTI acquisition. For each voxel, the gradient direction with the largest diffusion coefficient, $\mu_{max}$, may be identified as the main diffusion direction for that particular voxel. Projections, or components, of the vectors of all remaining directions may then be calculated along the main diffusion direction using an inner vector product on a voxel-by-voxel basis. The magnitude of these projections may then be calculated and ordered by size. An average vector may then be calculated as the directional average of the main direction, that is the direction of the maximum diffusivity, and a predefined number of the next largest diffusivities, e.g., two more directions, corresponding to a predefined number of the gradient directions with the largest projections along the main diffusion direction. The components of this average vector are then used to calculate a color-coded image in a manner analogous to that obtained from a DTI analysis. An image produced from AV calculations in accordance with embodiments disclosed herein provides for unexpected results, and in many cases may provide image components that may not be available in a conventional DTI analysis.

Referring to FIGS. 12, 13A, 13B, 13C, and 13D, an exemplary embodiment of an MRI AV processing routine implemented in accordance with embodiments disclosed herein is described. The processing routine 1200 is invoked at step 1202, and images of a specimen are acquired at step 1204, for example by application of a commercial DTI pulse sequence in MRI system 100. The acquired images may then be transferred to a workstation, such as computer system 20 depicted in FIG. 1, for post processing at step 1206, e.g., in the form of a DICOM file.

Figure 13A:
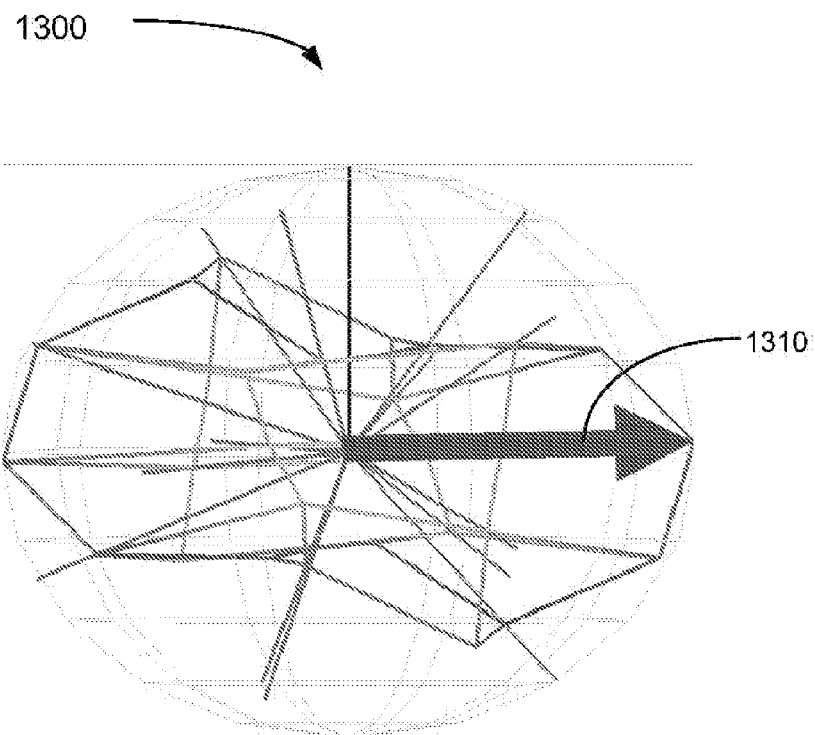
FIG. 13A depicts a diagrammatic representation of a diffusion profile including a vector that graphically represents a diffusion gradient direction along which the highest diffusion coefficient is identified in accordance with an embodiment.

A directional diffusion coefficient, $\mu_i$, may then be calculated on each pixel element, e.g., on each voxel, of the acquired image data along each diffusion gradient direction at step 1208. An average diffusion coefficient, $\mu$, may then be calculated over all directions for a voxel element at step 1210 according to equation 4. In accordance with an embodiment, the diffusion gradient direction with the highest diffusion coefficient may then be determined at step 1212, e.g., by ordering the diffusion coefficient values calculated for the voxel. FIG. 13A depicts a diagrammatic representation of a diffusion profile 1300 including a vector 1310 that graphically represents a diffusion gradient direction along which the highest diffusion coefficient, $\mu_{max}$, is identified according to step 1210. That is, vector 1310 depicts the main diffusion direction and the magnitude thereof.

Figure 13B:
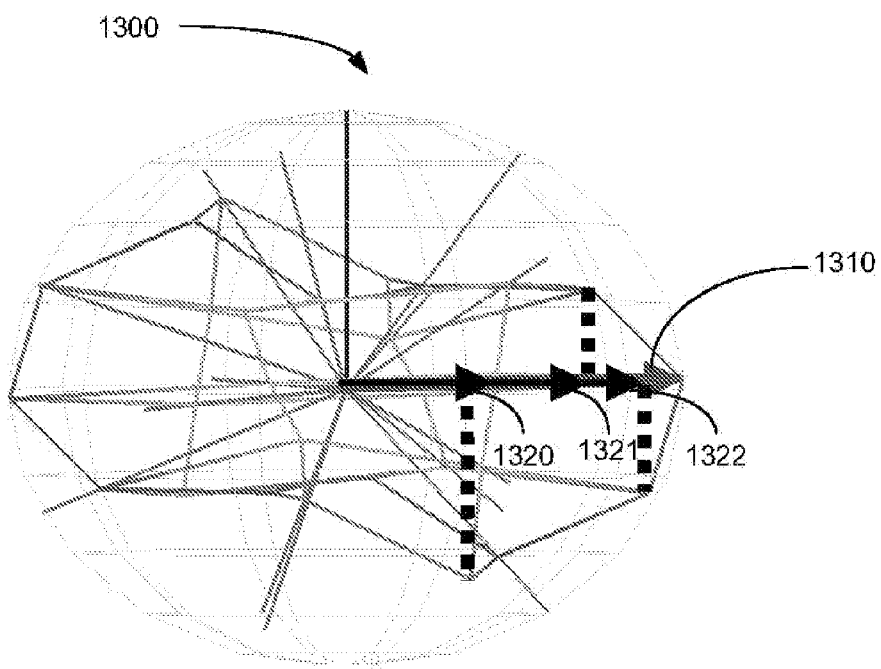
FIG. 13B depicts a diagrammatic representation of the diffusion profile of FIG. 13A including exemplary components of three diffusion coefficients calculated along the maximum diffusion coefficient direction in accordance with an embodiment.

Upon calculation of the diffusion gradient direction represented by vector 1310 with the highest diffusion coefficient value, components 1320-1322 along the maximum diffusion coefficient direction of the diffusion coefficients in the other directions may be calculated at step 1214. FIG. 13B depicts a diagrammatic representation of diffusion profile 1300 including exemplary components 1320, 1321, and 1322 of three diffusion coefficients, $\mu_i$, calculated along the maximum diffusion coefficient direction represented by vector 1310. The components of the diffusion coefficient in the remaining directions may similarly be calculated along the maximum diffusion coefficient direction.

Figure 13C:
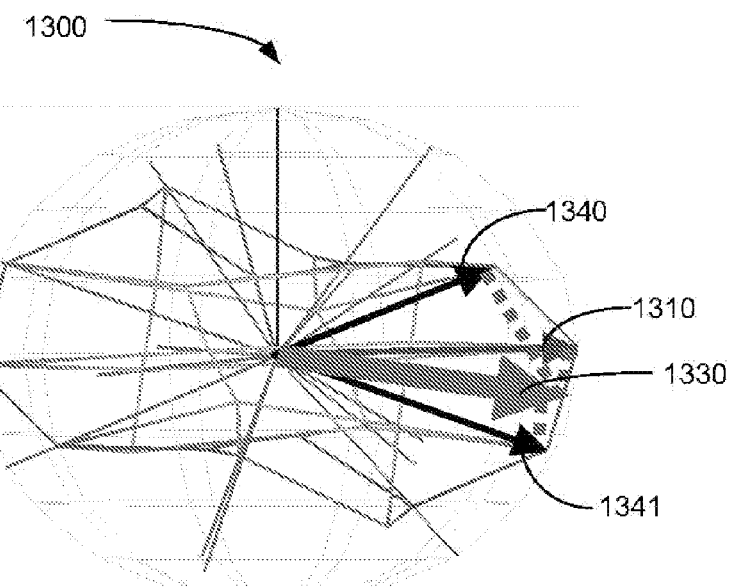
FIG. 13C depicts a diagrammatic representation of the diffusion profile of FIGS. 13A and 13B including a graphical representation of an average vector calculated in accordance with embodiments disclosed herein.
Figure 13D:
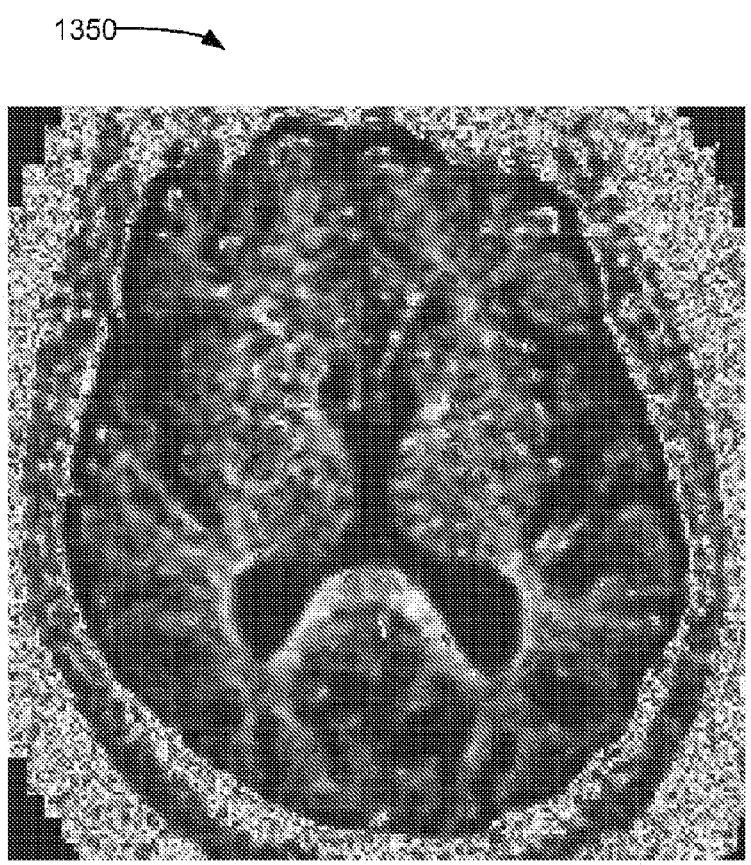
FIG. 13D depicts a synthetic color image that may be generated to visualize the average vector calculated according to the flowchart of FIG. 12 in accordance with an embodiment.
Figure 14A:
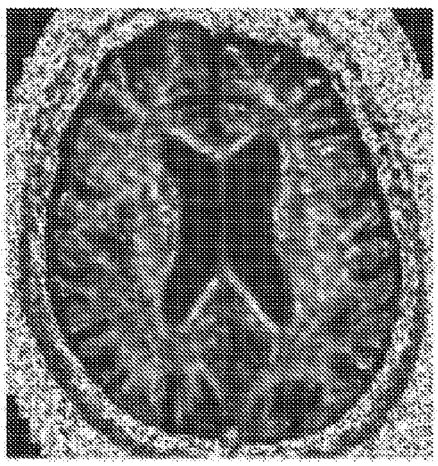
FIGS. 14A-14D respectively depict examples of color-coded images of axial slices of a brain specimen generated using conventional diffusion tensor imaging processing mechanisms and color-coded images generated using average vector color-coding mechanisms in accordance with embodiments disclosed herein.
Figure 14B:
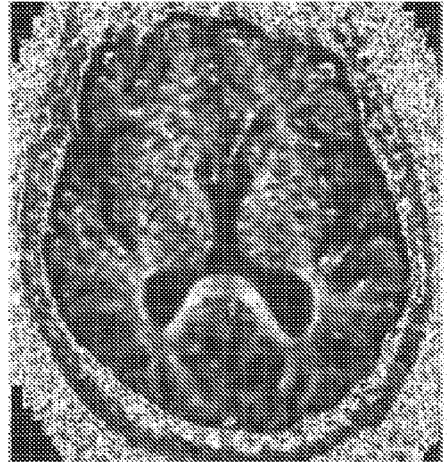
Figure 14C:
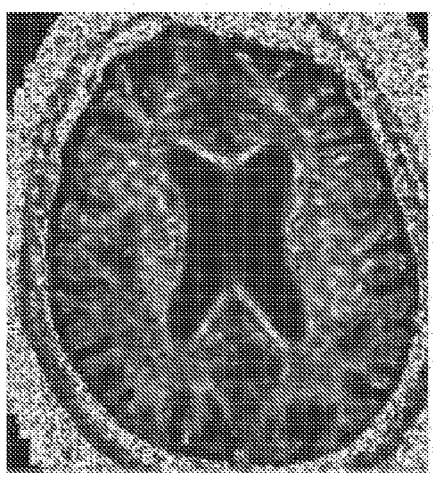
Figure 14D:
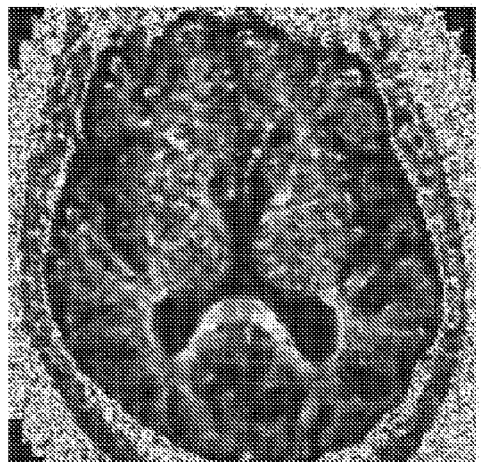

An enhanced estimation of the maximum diffusion coefficient direction of directions 500, 501, 502, 503, 504, 505, 506, 507, 508, 509, 510, 511, 512, 513, and 514 may be calculated by averaging a predefined number of the largest diffusion coefficient components along the main diffusion direction represented by vector 1310 at step 1216. In an exemplary embodiment, an average diffusion direction calculated by averaging the direction of a pre-defined number of the diffusion directions with the largest coefficient value components along the main diffusion direction is referred to as an average main diffusion direction. In an exemplary embodiment, the three directions with the respective three highest diffusion coefficient value components along the main diffusion direction including the maximum diffusion coefficient identified in step 1212 may be averaged to obtain the average main diffusion direction. Additionally, an average vector (AV), that is the direction obtained by averaging the three highest diffusion coefficient directions and the averaged diffusion coefficient of these three directions may be calculated. FIG. 13C depicts a diagrammatic representation of diffusion profile 1300 including a graphical representation of an average vector 1330. As depicted, average vector 1330 is calculated as a vector average, e.g., an average of the magnitudes and directions, of the maximum diffusion coefficient vector 1310 and the two next highest maximum diffusion coefficient vectors 1340-1341 and is representative of the average main diffusion direction and the magnitude thereof.

After calculation of the average vector, AV, an evaluation may be made to determine if additional voxels remain in the image to be processed at step 1218. If additional voxels remain, processing may return to calculation of the directional diffusion coefficients of the voxel according to step 1208. When all voxels of the image have been processed, a synthetic color image, such as color image 1350 depicted in FIG. 13D, may then be generated to visualize the AV at step 1220. 3D diffusion profiles similar to those described with reference to FIG. 10 may then be generated for the pixels of image 1350 at step 1222. Preferably, the 3D diffusion profiles generated for the image pixels are interactive allowing a user to rotate, zoom, or perform other graphical functions on the profiles. The average vector processing routine cycle may then end according to step 1224.

It is understood that a rendering or production of the diffusion profiles depicted in FIGS. 13A-13C is not necessary for obtaining the 3D images and profiles, but rather are provided only to graphically depict various processing steps of flowchart 1200. Possible applications of the AV analysis techniques described herein include better visualization of white matter diseases and more accurate measuring and monitoring of changes in the diffusion anisotropy in normal and pathologic white matter.

FIGS. 14A-14D depict examples of color-coded images 1400 and 1410 of exemplary axial slices of a brain specimen generated using conventional DTI processing mechanisms and color-coded images 1420 and 1430 generated using average vector color-coding (AVCC) mechanisms in accordance with embodiments disclosed herein and as described in FIG. 12 and FIGS. 13A-13D. In the illustrative example, DTI image 1400 and AVCC image 1420 have been generated from a common MRI data source, and DTI image 1410 and AVCC image 1430 have been generated from a common MRI data source to provide a graphical depiction of the variations in the imaging obtained from embodiments disclosed herein with respect to those obtained according to conventional image processing methodologies. As can be seen, AVCC images 1420 and 1430 appear sharper and reveal more detail than FIGS. 1400 and 1410 generated from conventional DTI processing methods. Advantageously, AVCC images may provide for better detection and monitoring of small changes caused by disease compared to images obtained by DTI processing mechanisms.

Information contained in AVCC images generated in accordance with embodiments of the disclosure may further be used to perform white matter fiber tracking with advantages over white matter fiber tracking utilizing conventional DTI analysis. Fiber tracking algorithms attempt to recreate the path of white matter fibers by following the main diffusion direction from voxel to voxel of an image.

Figure 15B:
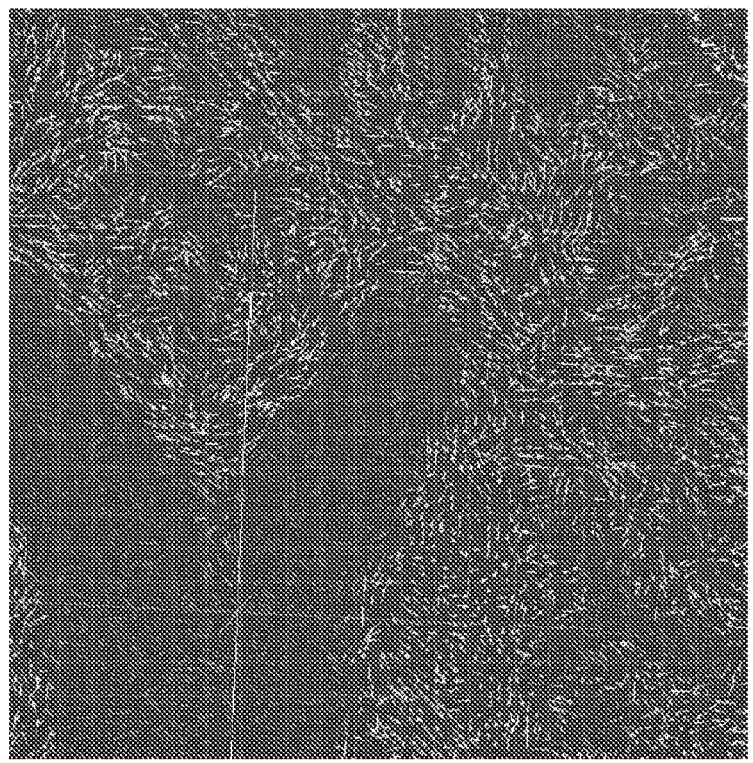
FIGS. 15A-15B respectively depict an image with directional diffusion information generated according to conventional diffusion tensor imaging processing routines and an image with directional diffusion information generated according to average vector calculations in accordance with embodiments disclosed herein.
Figure 15A:
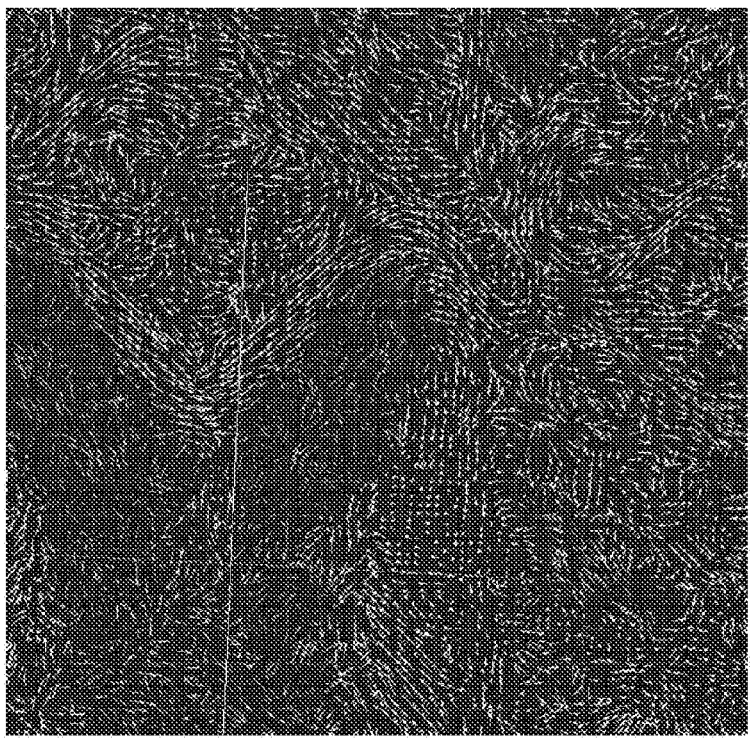

FIGS. 15A and 15B respectively depict an image 1500 displaying the directional diffusion information generated according to conventional DTI processing routines and an image 1510 displaying the directional diffusion information generated from AV calculations in accordance with embodiments disclosed herein. Particularly, the DTI image 1500 is obtained by displaying the maximum eigenvector obtained from the DTI analysis for each image voxel, while the AV image 1510 is produced by displaying the average vector obtained as described above. The directional diffusion information of image 1500 visually appears to be more ordered and the aesthetic characteristics of image 1500 may be more pleasant to the eye, while the directional diffusion information in image 1510 appears to be more detailed and may better reflect the actual conditions in biological tissue.

As described, a system, method, and computer-readable medium for MRI post-processing are provided. MRI post-processing mechanisms described herein do not rely on a DTI analysis to calculate diffusion anisotropy values in each MRI voxel, but rather derive directional data directly from the original MRI images to characterize the diffusion anisotropy in each voxel. Additionally, mechanisms for generating a three-dimensional diffusion profile are provided which may be used to visualize fiber crossing in an MRI voxel. Calculation of directional anisotropy values in accordance with embodiments disclosed herein is made directly from the values of diffusion coefficients at the different diffusion gradient directions sampled during the MR DTI acquisition. Advantageously, imaging post-processing mechanisms provided by embodiments disclosed herein are not subject to various deficiencies of fractional anisotropy post-processing mechanisms, and enhanced image resolution may be achieved by embodiments of the subject disclosure. Implementations of the present disclosure may exhibit particular advantages in white matter fiber tracking clinical applications, although the application of embodiments disclosed herein is not limited to any particular imaging scenario.

Embodiments disclosed herein provide a method for processing magnetic resonance imaging data. Image data having a plurality of voxels is acquired from a magnetic resonance imaging scanner by application of a diffusion tensor imaging pulse sequence to a specimen. A respective diffusion coefficient is calculated for each of a plurality of gradient directions for each of the plurality of voxels. An average diffusion coefficient value may be calculated for each respective diffusion coefficient for each of the plurality of voxels. A directional anisotropy value may be calculated from the average diffusion coefficient value and each respective diffusion coefficient for each of the plurality of voxels. The average diffusion coefficient value may be calculated by summing each respective diffusion coefficient, and dividing the sum by a number of the plurality of diffusion gradient directions. The method may further comprise generating an image from the directional anisotropy value of each of the plurality of voxels. The method may further comprise generating a three-dimensional profile for at least one of the plurality of voxels. Generation of the three-dimensional profile may comprise plotting each respective diffusion coefficient as a node on a line representative of a respective one of the plurality of diffusion gradient directions, and generating a polygon with each node intersecting a surface of the polygon. The location of a node on a line may be dependent on a value of the diffusion coefficient represented by the node. The method may further comprise determining a main diffusion gradient direction having the highest diffusion coefficient value for each of the plurality of voxels. The method may further comprise calculating, for each of the diffusion gradient directions excluding the main diffusion gradient direction, a respective component of the diffusion coefficient along the main diffusion gradient direction. An average vector may be calculated for each of the plurality of voxels and may comprise an average of a pre-defined number of diffusion coefficients having the largest component along the main diffusion direction. An image may be generated from the average vector.

In accordance with another embodiment, a computer-readable medium having computer-executable instructions for execution by a processing system, the computer-executable instructions for processing magnetic resonance imaging data is provided. The computer-readable medium may comprise instructions that acquire image data having a plurality of voxels on a magnetic resonance imaging scanner by application of a diffusion tensor imaging pulse sequence to a specimen, instructions that calculate a respective diffusion coefficient for each of a plurality of gradient directions for each of the plurality of voxels, and instructions that calculate an average diffusion coefficient value of each respective diffusion coefficient for each of the plurality of voxels. The computer-readable medium may further include instructions that calculate a directional anisotropy value from the average diffusion coefficient value and each respective diffusion coefficient for each of the plurality of voxels. The instructions that calculate an average diffusion coefficient value may calculate a sum of each respective diffusion coefficient and divide the sum by a number of the plurality of diffusion gradient directions. The computer-readable medium may further comprise instructions that generate an image from the directional anisotropy value of each of the plurality of voxels. The computer-readable medium may further comprise instructions that generate a three-dimensional profile for at least one of the plurality of voxels. The instructions that generate a three-dimensional profile may plot each respective diffusion coefficient as a node on a line representative of a respective one of the plurality of diffusion gradient directions and generate a polygon with each node intersecting a surface of the polygon. A location of a node on a line is dependent on a value of the diffusion coefficient represented by the node. The computer-readable medium may further comprise instructions that determine a main diffusion gradient direction having the highest diffusion coefficient value for each of the plurality of voxels. The computer-readable medium may further comprise instructions that calculate, for each of the diffusion gradient directions excluding the main diffusion gradient direction, a respective component of the diffusion coefficient along the main diffusion gradient direction. The computer-readable medium may further comprise instructions that calculate an average vector, for each of the plurality of voxels, comprising an average of a pre-defined number of diffusion coefficients having the largest component along the main diffusion direction. An image may be generated from the average vector.

In accordance with another embodiment, a system for processing magnetic resonance imaging data is provided. The system may comprise a magnetic resonance imaging scanner, a scanner system controller adapted to supply a diffusion tensor imaging pulse sequence to the magnetic resonance imaging scanner and receive and digitize magnetic resonance image signals therefrom, and a computer system coupled with the scanner control system adapted to receive a digital magnetic resonance image comprising a plurality of voxels. A respective diffusion coefficient may be calculated for each of a plurality of gradient directions for each of the plurality of voxels, and an average diffusion coefficient value of each respective diffusion coefficient for each of the plurality of voxels may be calculated. A directional anisotropy value may be calculated from the average diffusion coefficient value and each respective diffusion coefficient for each of the plurality of voxels. The average diffusion coefficient value may comprise a sum of each respective diffusion coefficient for a particular voxel divided by a number of the plurality of diffusion gradient directions. An image may be generated from the directional anisotropy value of each of the plurality of voxels, and a three-dimensional profile may be generated for at least one of the plurality of voxels. The three-dimensional profile may be generated by plotting each respective diffusion coefficient as a node on a line representative of a respective one of the plurality of diffusion gradient directions, and a polygon may be generated with each node intersecting a surface of the polygon. A location of a node on a line is dependent on a value of the diffusion coefficient represented by the node. The computer system may determine a main diffusion gradient direction having the highest diffusion coefficient value for each of the plurality of voxels. The computer system may calculate, for each of the diffusion gradient directions excluding the main diffusion gradient direction, a respective component of the diffusion coefficient along the main diffusion gradient direction. The computer system may calculate an average vector, for each of the plurality of voxels, comprising an average of a pre-defined number of diffusion coefficients having the largest component along the main diffusion direction. An image may be generated from the average vector.

In accordance with another embodiment, a magnetic resonance imaging system is provided. The system may comprise means for acquiring image data having a plurality of voxels on a magnetic resonance imaging scanner by application of a diffusion tensor imaging pulse sequence to a specimen, means for calculating a respective diffusion coefficient for each of a plurality of gradient directions for each of the plurality of voxels, and means for calculating an average diffusion coefficient value of each respective diffusion coefficient for each of the plurality of voxels. The system may further include means for calculating a directional anisotropy value from the average diffusion coefficient value and each respective diffusion coefficient for each of the plurality of voxels. The means for calculating an average diffusion coefficient value may comprise means for calculating a sum of each respective diffusion coefficient, and means for dividing the sum by a number of the plurality of diffusion gradient directions. The system may further comprise means for generating an image from the directional anisotropy value of each of the plurality of voxels. The system may further comprise means for generating a three-dimensional profile for at least one of the plurality of voxels. The means for generating a three-dimensional profile may comprise means for plotting each respective diffusion coefficient as a node on a line representative of a respective one of the plurality of diffusion gradient directions, and means for generating a polygon with each node intersecting a surface of the polygon. A location of a node on a line may be dependent on a value of the diffusion coefficient represented by the node. The system may further comprise means for determining a main diffusion gradient direction having the highest diffusion coefficient value for each of the plurality of voxels. The system may further comprise means for calculating, for each of the diffusion gradient directions excluding the main diffusion gradient direction, a respective component of the diffusion coefficient along the main diffusion gradient direction. The system may further comprise means for calculating an average vector, for each of the plurality of voxels, comprising an average of a pre-defined number of diffusion coefficients having the largest component along the main diffusion direction. The system may further comprise means for generating an image from the average vector.

In accordance with another embodiment, a method of processing magnetic resonance imaging data is provided. Image data having a plurality of voxels is acquired on a magnetic resonance imaging scanner by application of a diffusion tensor imaging pulse sequence to a specimen. A respective diffusion coefficient for each of a plurality of gradient directions along which the imaging data was obtained for each of the plurality of voxels is calculated. A sum of each respective diffusion coefficient is calculated for each of the plurality of gradient directions for each of the plurality of voxels. An average diffusion coefficient is calculated by dividing the sum by a number of the plurality of diffusion gradient directions for each of the plurality of voxels. A directional anisotropy value is calculated from the average diffusion coefficient value and each respective diffusion coefficient for each of the plurality of voxels. A color-coded image is generated from the directional anisotropy value calculated for each of the plurality of voxels. The color-coded image may comprise a first color designating superior-inferior, a second color designating right-left, and a third color designating anterior-posterior.

In accordance with another embodiment, a computer-readable medium having computer-executable instructions for execution by a processing system for processing magnetic resonance imaging data is provided. The computer-readable medium comprises instructions that acquire image data having a plurality of voxels on a magnetic resonance imaging scanner by application of a diffusion tensor imaging pulse sequence to a specimen, instructions that calculate a respective diffusion coefficient for each of a plurality of gradient directions along which the imaging data was obtained for each of the plurality of voxels, instructions that calculate a sum of each respective diffusion coefficient calculated for each of the plurality of gradient directions for each of the plurality of voxels, instructions that calculate an average diffusion coefficient by dividing the sum by a number of the plurality of diffusion gradient directions for each of the plurality of voxels, instructions that calculate a directional anisotropy value from the average diffusion coefficient value and each respective diffusion coefficient for each of the plurality of voxels, and instructions that generate a color-coded image from the directional anisotropy value calculated for each of the plurality of voxels. The color-coded image may comprise a first color designating superior-inferior, a second color designating right-left, and a third color designating anterior-posterior.

In accordance with another embodiment, a magnetic resonance imaging system is provided. The system may comprise means for acquiring image data having a plurality of voxels on a magnetic resonance imaging scanner by application of a diffusion tensor imaging pulse sequence to a specimen, means for calculating a respective diffusion coefficient for each of a plurality of gradient directions along which the imaging data was obtained for each of the plurality of voxels, means for calculating a sum of each respective diffusion coefficient calculated for each of the plurality of gradient directions for each of the plurality of voxels, means for calculating an average diffusion coefficient by dividing the sum by a number of the plurality of diffusion gradient directions for each of the plurality of voxels, means for calculating a directional anisotropy value from the average diffusion coefficient value and each respective diffusion coefficient for each of the plurality of voxels, and means for generating a color-coded image from the directional anisotropy value calculated for each of the plurality of voxels. The color-coded image may comprise a first color designating superior-inferior, a second color designating right-left, and a third color designating anterior-posterior.

In accordance with another embodiment, a system for processing magnetic resonance imaging data is provided. The system may comprise a magnetic resonance imaging scanner, a scanner system controller adapted to supply a diffusion tensor imaging pulse sequence to the magnetic resonance imaging scanner and receive and digitize magnetic resonance image signals therefrom, and a computer system coupled with the scanner control system adapted to receive a digital magnetic resonance image comprising a plurality of voxels. The computer system may calculate a respective diffusion coefficient for each of a plurality of gradient directions along which the imaging data was obtained for each of the plurality of voxels, calculate a sum of each respective diffusion coefficient calculated for each of the plurality of gradient directions for each of the plurality of voxels, calculate an average diffusion coefficient by dividing the sum by a number of the plurality of diffusion gradient directions for each of the plurality of voxels, calculate a directional anisotropy value from the average diffusion coefficient value and each respective diffusion coefficient for each of the plurality of voxels, and generate a color-coded image from the directional anisotropy value calculated for each of the plurality of voxels. The color-coded image may comprise a first color designating superior-inferior, a second color designating right-left, and a third color designating anterior-posterior.

Figure 12:
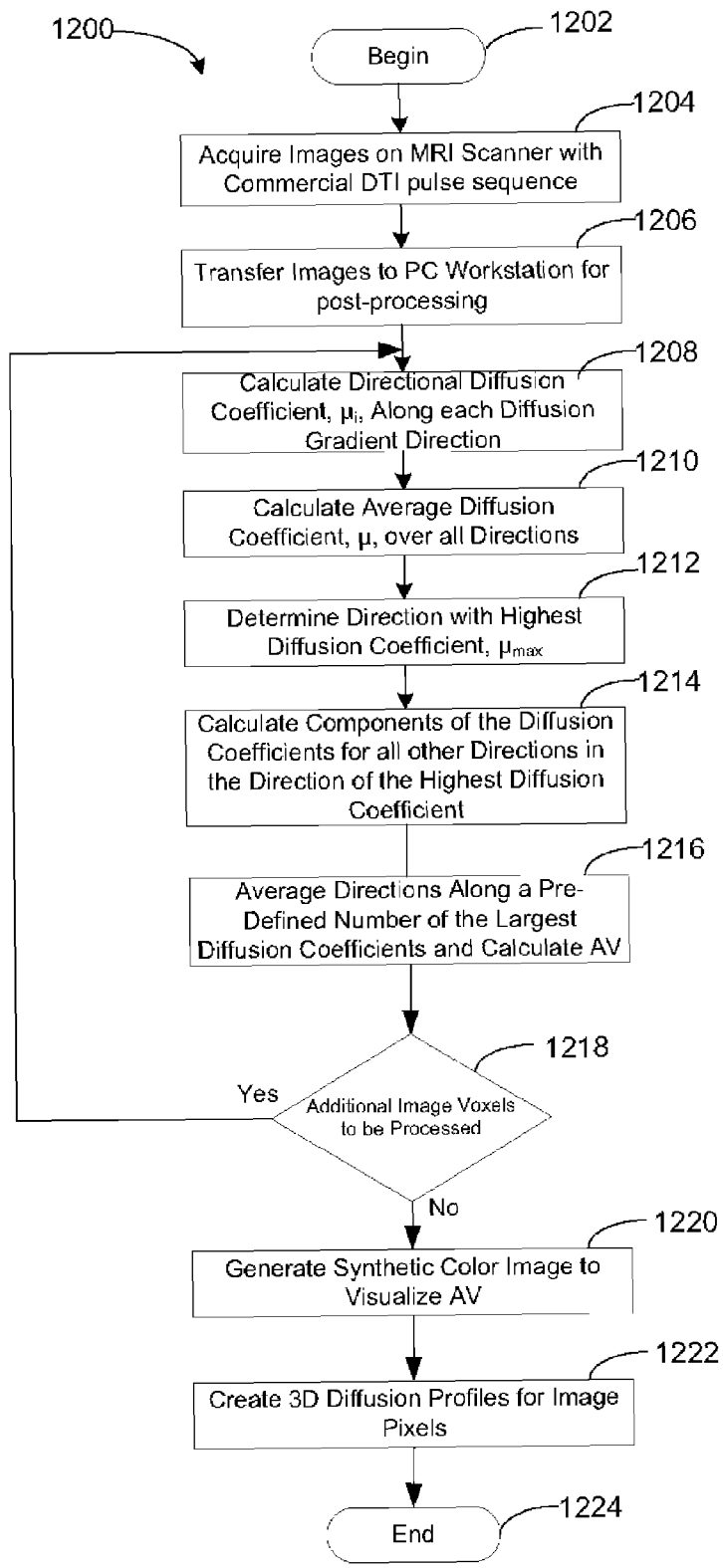
FIG. 12 depicts a flowchart of a magnetic resonance imaging average vector processing routine implemented in accordance with embodiments disclosed herein.

The flowcharts of FIGS. 6 and 12 depict process serialization to facilitate an understanding of disclosed embodiments and are not necessarily indicative of the serialization of the operations being performed. In various embodiments, the processing steps described in FIGS. 6 and 12 may be performed in varying order, and one or more depicted steps may be performed in parallel with other steps. Additionally, execution of some processing steps of FIGS. 6 and 12 may be excluded without departing from embodiments disclosed herein. The illustrative block diagrams and flowcharts depict process steps or blocks that may represent modules, segments, or portions of code that include one or more executable instructions for implementing specific logical functions or steps in the process. Although the particular examples illustrate specific process steps or procedures, many alternative implementations are possible and may be made by simple design choice. Some process steps may be executed in different order from the specific description herein based on, for example, considerations of function, purpose, conformance to standard, legacy structure, user interface design, and the like.

Aspects of the present invention may be implemented in software, hardware, firmware, or a combination thereof. The various elements of the system, either individually or in combination, may be implemented as a computer program product tangibly embodied in a machine-readable storage device for execution by a processing unit. Various steps of embodiments of the invention may be performed by a computer processor executing a program tangibly embodied on a computer-readable medium to perform functions by operating on input and generating output. The computer-readable medium may be, for example, a memory, a transportable medium such as a compact disk, a floppy disk, or a diskette, such that a computer program embodying the aspects of the present invention can be loaded onto a computer. The computer program is not limited to any particular embodiment, and may, for example, be implemented in an operating system, application program, foreground or background process, driver, network stack, or any combination thereof, executing on a single computer processor or multiple computer processors. Additionally, various steps of embodiments of the invention may provide one or more data structures generated, produced, received, or otherwise implemented on a computer-readable medium, such as a memory.

Although embodiments of the present disclosure have been described in detail, those skilled in the art should understand that they may make various changes, substitutions and alterations herein without departing from the spirit and scope of the present disclosure.

What is claimed is:

1. A system for processing magnetic resonance imaging data, comprising:
    a magnetic resonance imaging scanner;
    a scanner system controller adapted to supply a diffusion tensor imaging pulse sequence to the magnetic resonance imaging scanner and receive and digitize magnetic resonance image signals therefrom; and
    a computer system coupled with the scanner control system adapted to receive a digital magnetic resonance image comprising a plurality of voxels, calculate a respective diffusion coefficient for each of a plurality of gradient directions along which the imaging data was obtained for each of the plurality of voxels, calculate a sum of each respective diffusion coefficient calculated for each of the plurality of gradient directions for each of the plurality of voxels, calculate an average diffusion coefficient by dividing the sum by a number of the plurality of diffusion gradient directions for each of the plurality of voxels, calculate a directional anisotropy value from the average diffusion coefficient value and each respective diffusion coefficient for each of the plurality of voxels, and generate a color-coded image from the directional anisotropy value calculated for each of the plurality of voxels, wherein the color-coded image comprises a first color designating superior-inferior, a second color designating right-left, and a third color designating anterior-posterior.

2. A magnetic resonance imaging system, comprising:
    means for acquiring image data having a plurality of voxels on a magnetic resonance imaging scanner by application of a diffusion tensor imaging pulse sequence to a specimen;
    means for calculating a respective diffusion coefficient for each of a plurality of gradient directions along which the imaging data was obtained for each of the plurality of voxels;
    means for calculating a sum of each respective diffusion coefficient calculated for each of the plurality of gradient directions for each of the plurality of voxels;
    means for calculating an average diffusion coefficient by dividing the sum by a number of the plurality of diffusion gradient directions for each of the plurality of voxels;
    means for calculating a directional anisotropy value from the average diffusion coefficient value and each respective diffusion coefficient for each of the plurality of voxels; and
    means for generating a color-coded image from the directional anisotropy value calculated for each of the plurality of voxels, wherein the color-coded image comprises a first color designating superior-inferior, a second color designating right-left, and a third color designating anterior-posterior.

3. A method of processing magnetic resonance imaging data, comprising:
    acquiring image data having a plurality of voxels on a magnetic resonance imaging scanner by application of a diffusion tensor imaging pulse sequence to a specimen;
    calculating a respective diffusion coefficient for each of a plurality of gradient directions along which the imaging data was obtained for each of the plurality of voxels;
    calculating a sum of each respective diffusion coefficient calculated for each of the plurality of gradient directions for each of the plurality of voxels;
    calculating an average diffusion coefficient by dividing the sum by a number of the plurality of diffusion gradient directions for each of the plurality of voxels;
    calculating a directional anisotropy value from the average diffusion coefficient value and each respective diffusion coefficient for each of the plurality of voxels; and
    generating a color-coded image from the directional anisotropy value calculated for each of the plurality of voxels, wherein the color-coded image comprises a first color designating superior-inferior, a second color designating right-left, and a third color designating anterior-posterior.

4. A computer-readable medium having computer-executable instructions for execution by a processing system, the computer-executable instructions for processing magnetic resonance imaging data, comprising:
    instructions that acquire image data having a plurality of voxels on a magnetic resonance imaging scanner by application of a diffusion tensor imaging pulse sequence to a specimen;
    instructions that calculate a respective diffusion coefficient for each of a plurality of gradient directions along which the imaging data was obtained for each of the plurality of voxels;
    instructions that calculate a sum of each respective diffusion coefficient calculated for each of the plurality of gradient directions for each of the plurality of voxels;
    instructions that calculate an average diffusion coefficient by dividing the sum by a number of the plurality of diffusion gradient directions for each of the plurality of voxels;
    instructions that calculate a directional anisotropy value from the average diffusion coefficient value and each respective diffusion coefficient for each of the plurality of voxels; and
    instructions that generate a color-coded image from the directional anisotropy value calculated for each of the plurality of voxels, wherein the color-coded image comprises a first color designating superior-inferior, a second color designating right-left, and a third color designating anterior-posterior.

5. A magnetic resonance imaging system, comprising:
means for acquiring image data having a plurality of voxels on a magnetic resonance imaging scanner by application of a diffusion tensor imaging pulse sequence to a specimen;
means for calculating a respective diffusion coefficient for each of a plurality of gradient directions for each of the plurality of voxels; and
means for calculating, for each voxel of the plurality of voxels, an average diffusion coefficient value from each diffusion coefficient calculated for the voxel.

6. The system of claim 5, wherein the means for calculating an average diffusion coefficient value comprises:
means for calculating a sum of each respective diffusion coefficient; and
means for dividing the sum by a number of the plurality of diffusion gradient directions.

7. The system of claim 5, further comprising means for calculating a directional anisotropy value from the average diffusion coefficient value and each respective diffusion coefficient for each of the plurality of voxels.

8. The system of claim 7, further comprising means for generating an image from the directional anisotropy value of each of the plurality of voxels.

9. The system of claim 5, further comprising means for generating a three-dimensional profile for at least one of the plurality of voxels.

10. The system of claim 9, wherein the means for generating a three-dimensional profile further comprises:
means for plotting each respective diffusion coefficient as a node on a line representative of a respective one of the plurality of diffusion gradient directions; and
means for generating a polygon with each node intersecting a surface of the polygon.

11. The system of claim 10, wherein a location of a node on a line is dependent on a value of the diffusion coefficient represented by the node.

12. The system of claim 5, further comprising means for determining a main diffusion gradient direction having the highest diffusion coefficient value for each of the plurality of voxels.

13. The system of claim 12, further comprising means for calculating, for each of the diffusion gradient directions excluding the main diffusion gradient direction, a respective component of the diffusion coefficient along the main diffusion gradient direction.

14. The system of claim 13, further comprising means for calculating an average vector, for each of the plurality of voxels, comprising an average of a pre-defined number of diffusion coefficients having the largest component along the main diffusion direction.

15. The system of claim 14, further comprising means for generating an image from the average vector.

16. A system for processing magnetic resonance imaging data, comprising:
a magnetic resonance imaging scanner;
a scanner system controller adapted to supply a diffusion tensor imaging pulse sequence to the magnetic resonance imaging scanner and receive and digitize magnetic resonance image signals therefrom; and
a computer system coupled with the scanner control system adapted to receive a digital magnetic resonance image comprising a plurality of voxels, calculate a respective diffusion coefficient for each of a plurality of gradient directions for each of the plurality of voxels, and calculate, for each voxel of the plurality of voxels, an average diffusion coefficient value from each diffusion coefficient calculated for the voxel.

17. The system of claim 16, wherein the average diffusion coefficient value comprises a sum of each respective diffusion coefficient for a particular voxel divided by a number of the plurality of diffusion gradient directions.

18. The system of claim 16, wherein a directional anisotropy value is calculated, for each voxel of the plurality of voxels, from the average diffusion coefficient value and each diffusion coefficient of the voxel.

19. The system of claim 18, wherein an image is generated from the directional anisotropy value of each of the plurality of voxels.

20. The system of claim 16, wherein a three-dimensional profile is generated for at least one of the plurality of voxels.

21. The system of claim 20, wherein the three-dimensional profile is generated by plotting each respective diffusion coefficient as a node on a line representative of a respective one of the plurality of diffusion gradient directions, and generating a polygon with each node intersecting a surface of the polygon.

22. The system of claim 21, wherein a location of a node on a line is dependent on a value of the diffusion coefficient represented by the node.

23. The system of claim 16, wherein the computer system determines a main diffusion gradient direction having the highest diffusion coefficient value for each of the plurality of voxels.

24. The system of claim 23, wherein the computer system calculates, for each of the diffusion gradient directions excluding the main diffusion gradient direction, a respective component of the diffusion coefficient along the main diffusion gradient direction.

25. The system of claim 24, wherein the computer systems calculates an average vector, for each of the plurality of voxels, comprising an average of a pre-defined number of diffusion coefficients having the largest component along the main diffusion direction.

26. The system of claim 25, wherein an image is generated from the average vector.

27. A computer-readable medium having computer-executable instructions for execution by a processing system, the computer-executable instructions for processing magnetic resonance imaging data, comprising:
instructions that acquire image data having a plurality of voxels on a magnetic resonance imaging scanner by application of a diffusion tensor imaging pulse sequence to a specimen;
instructions that calculate a respective diffusion coefficient for each of a plurality of gradient directions for each of the plurality of voxels; and
instructions that calculate, for each voxel of the plurality of voxels, an average diffusion coefficient value from the diffusion coefficients calculated for the voxel.

28. The computer-readable medium of claim 27, wherein the instructions that calculate an average diffusion coefficient value calculate a sum of each respective diffusion coefficient, and divide the sum by a number of the plurality of diffusion gradient directions.

29. The computer-readable medium of claim 27, further comprising instructions that calculate a directional anisotropy value from the average diffusion coefficient value and each respective diffusion coefficient for each of the plurality of voxels.

30. The computer-readable medium of claim 29, further comprising instructions that generate an image from the directional anisotropy value of each of the plurality of voxels.

31. The computer-readable medium of claim 27, further comprising instructions that generate a three-dimensional profile for at least one of the plurality of voxels.

32. The computer-readable medium of claim 31, wherein the instructions that generate a three-dimensional profile plot each respective diffusion coefficient as a node on a line representative of a respective one of the plurality of diffusion gradient directions, and generate a polygon with each node intersecting a surface of the polygon.

33. The computer-readable medium of claim 32, wherein a location of a node on a line is dependent on a value of the diffusion coefficient represented by the node.

34. The computer-readable medium of claim 27, further comprising instructions that determine a main diffusion gradient direction having the highest diffusion coefficient value for each of the plurality of voxels.

35. The computer-readable medium of claim 34, further comprising instructions that calculate, for each of the diffusion gradient directions excluding the main diffusion gradient direction, a respective component of the diffusion coefficient along the main diffusion gradient direction.

36. The computer-readable medium of claim 35, further comprising instructions that calculate an average vector, for each of the plurality of voxels, comprising an average of a pre-defined number of diffusion coefficients having the largest component along the main diffusion direction.

37. The computer-readable medium of claim 36, further comprising instructions that generate an image from the average vector.

38. A method of processing magnetic resonance imaging data, comprising:
    acquiring image data having a plurality of voxels on a magnetic resonance imaging scanner by application of a diffusion tensor imaging pulse sequence to a specimen;
    calculating, for each of the plurality of voxels, a respective diffusion coefficient for each of a plurality of gradient directions; and
    calculating, for each voxel of the plurality of voxels, an average diffusion coefficient value from each diffusion coefficient calculated for the voxel.

39. The method of claim 38, wherein calculating an average diffusion coefficient value comprises:
    calculating a sum of each respective diffusion coefficient; and
    dividing the sum by a number of the plurality of diffusion gradient directions.

40. The method of claim 38, further comprising calculating, for each of the plurality of voxels, a directional anisotropy value from the average diffusion coefficient value and each respective diffusion coefficient for the voxel.

41. The method of claim 40, further comprising generating an image from the directional anisotropy value of each of the plurality of voxels.

42. The method of claim 38, further comprising generating a three-dimensional profile for at least one of the plurality of voxels.

43. The method of claim 42, wherein generating a three-dimensional profile further comprises:
    plotting each respective diffusion coefficient as a node on a line representative of a respective one of the plurality of diffusion gradient directions; and
    generating a polygon with each node intersecting a surface of the polygon.

44. The method of claim 43, wherein a location of a node on a line is dependent on a value of the diffusion coefficient represented by the node.

45. The method of claim 38, further comprising determining a main diffusion gradient direction having the highest diffusion coefficient value for each of the plurality of voxels.

46. The method of claim 45, further comprising calculating, for each of the diffusion gradient directions excluding the main diffusion gradient direction, a respective component of the diffusion coefficient along the main diffusion gradient direction.

47. The method of claim 46, further comprising calculating an average vector, for each of the plurality of voxels, comprising an average of a pre-defined number of diffusion coefficients having the largest component along the main diffusion direction.

48. The method of claim 47, further comprising generating an image from the average vector.

* * * * *